United States Patent [19]

Kloker

[11] Patent Number: 4,539,684
[45] Date of Patent: Sep. 3, 1985

[54] AUTOMATIC FRAME SYNCHRONIZATION RECOVERY UTILIZING A SEQUENTIAL DECODER

[75] Inventor: Kevin L. Kloker, Arlington Heights, Ill.

[73] Assignee: Motroloa, Inc., Schaumburg, Ill.

[21] Appl. No.: 456,233

[22] Filed: Jan. 7, 1983

[51] Int. Cl.³ .............................................. G06F 11/10
[52] U.S. Cl. ........................................ 371/46; 371/45
[58] Field of Search ...................... 371/46, 43, 44, 45; 375/114, 116

[56] References Cited

U.S. PATENT DOCUMENTS

| | | | |
|---|---|---|---|
| 3,789,359 | 1/1974 | Clark, Jr. et al. | 371/46 |
| 3,872,432 | 3/1975 | Bismarck | 371/46 |
| 3,882,457 | 5/1975 | En | 371/45 |
| 4,158,748 | 6/1979 | En | 375/116 |
| 4,312,070 | 1/1982 | Coombes et al. | 371/47 X |

Primary Examiner—Charles E. Atkinson
Attorney, Agent, or Firm—James W. Gillman; Ed Roney; James S. Pristelski

[57] ABSTRACT

A digital communication system including an encoder and decoder for the transmission of digital information over a transmission medium, the system having automatic frame synchronization and error correction requiring a minimum of tansmission bits and decoding time. The encoder processes a data stream and generates a transmission bit stream of N bits using convolutional encoding, autosynchronization sequence combining, and bit interleaving. The multi-phase sequential decoder decodes the received coded data, corrects transmission errors and automatically achieves frame synchronization from P selected phases of the received data. This is accomplished by selecting the phase of the received data with the best metric, bit de-interleaving, removing the autosynchronization sequence and comparing the received data of the selected phase with the extended code word subsets from the node having the best metric. The decoder then selects a new best metric node and phase in an iterative process until the decoding operation terminates with either valid decoded data upon reaching a terminal node or a code word erasure due to computation or memory overflow. Thus the decoder simultaneously searches for the correct phase and decoded data by iteratively maximizing the code word metric in one decoding operation.

12 Claims, 12 Drawing Figures

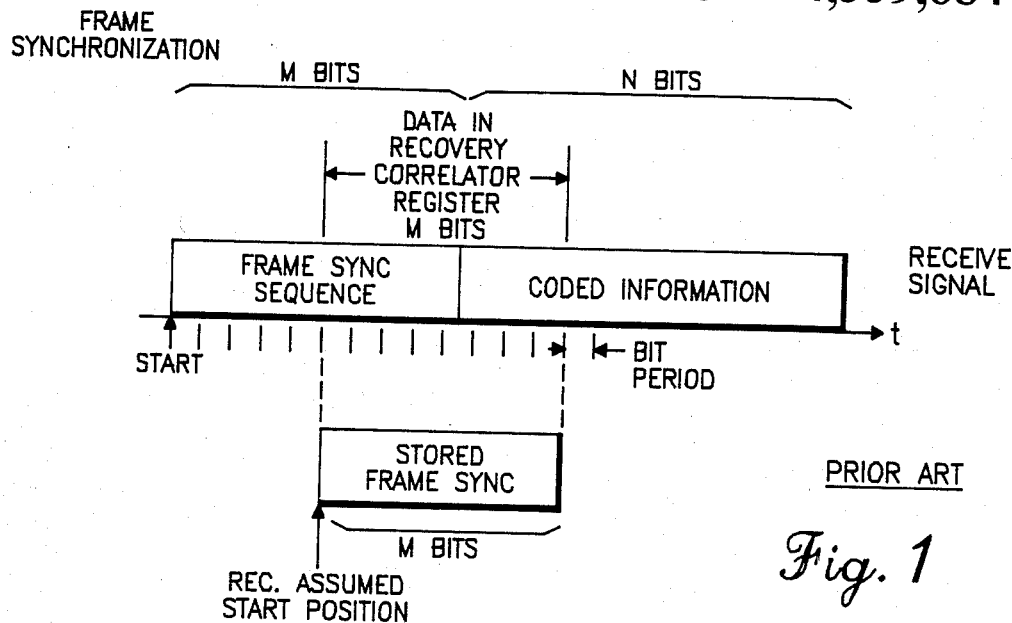
Fig. 1 PRIOR ART
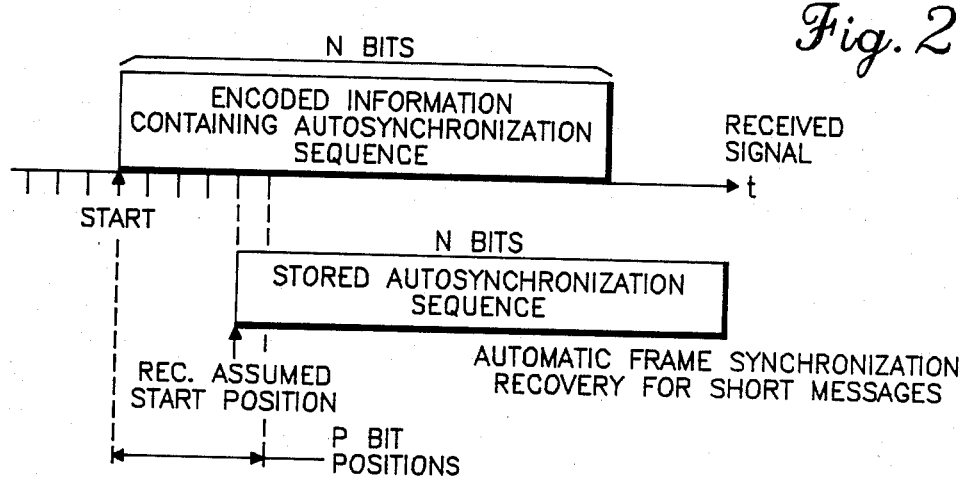
Fig. 2 AUTOMATIC FRAME SYNCHRONIZATION RECOVERY FOR SHORT MESSAGES
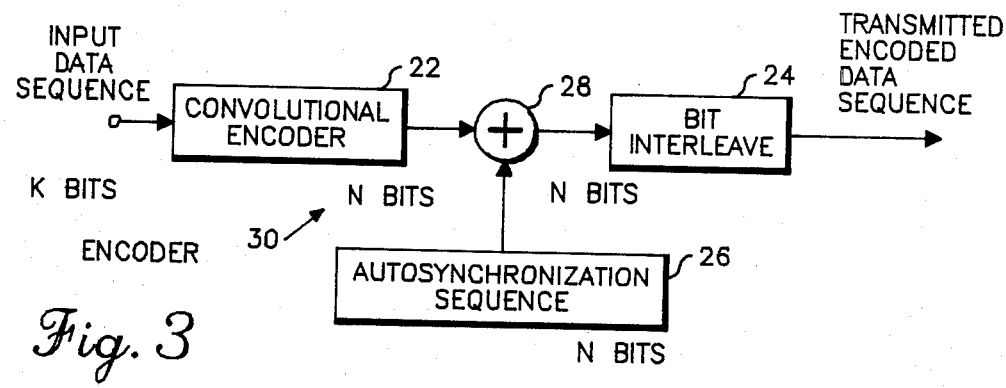
Fig. 3

AUTOMATIC FRAME SYNCHRONIZATION RECOVERY UTILIZING A SEQUENTIAL DECODER

BACKGROUND OF THE INVENTION

This invention relates to the digital communication arts and, more particularly, to a means for reducing the length of a transmission bit stream by combining synchronization bits with data bits and obtaining frame synchronization at the receiver by using a multiphase sequential decoder.

Digitally encoded communication systems are well known in the art. In such systems, a data bit stream containing digitally encoded information is transmitted over a noisy transmission medium. If the raw information data were transmitted without any error correction processing, there would exist a substantial probability that portions of the message might be irretrievably lost due to interference from the noisy medium. Therefore, this data is normally processed to produce a transmission bit stream, which, after decoding at the receiver, provides a means to correct or minimize transmission medium induced errors. Two examples of error correction processing schemes are the block and convolutional type codes.

Proper decoding of the transmission bit stream requires that the decoder be able to recognize and synchronize the received bit stream signal. This process is called frame synchronization. To assure proper decoding synchronization, the prior art has utilized a predetermined set of synchronization (sync) bits preceding the data bits. For example, N sync bits of a specific pattern may be transmitted, such as the well known Barker sequence, which optimizes the ability of the decoder to recognize and synchronize with the transmission bit stream. This is done by correlating the received bit stream with a reference pattern.

For short messages of less than about 200 channel bits, an improvement may be obtained by combining of the data bits with the sync bits by a modulo 2 adder, i.e. an exclusive OR function. The resulting transmission bit stream then has a total of less than the number of information bits plus the number of sync bits, thereby substantially minimizing the number of bits required to send the message. The decoder and the receiver then regenerate the data bit stream by another modulo 2 addition of the transmission bit stream with the sync bits stored within the decoder at the receiver to yield the original data bits. This technique is disclosed in U.S. Pat. No. 4,158,748 to John En issued June 19, 1979 and entitled "Apparatus for Digital Data Synchronization", which is assigned to the assignee of the present invention. The method disclosed in this patent utilizes a threshold detector which performs one complete correlation operation for each assumed start position, or phase, of the input data. That is, one complete frame synchronization attempt is needed per channel bit received.

A shortcoming of the aforementioned synchronization scheme is that a relatively significant amount of time is required to perform a decode operation for each received channel bit. In addition, a substantial number of information bits must be predefined as an identification sequence which can be correlated with the same predefined sequence stored at the decoder to detect frame synchronization. The requirement for a predefined information bit sequence necessarily reduces the effective number of information bits which may be specified in each code word to substantially less than N.

In some systems such as those which utilize master-slave or hand-shaking operations, or operate in a slotted contention mode, the frame synchronization phase will be known to within P bit positions. In such a case, it is very desirable to find a method of decoding such that the time required to perform a frame synchronization operation does not linearly increase with P. However, it should be noted that in instances where the phase is totally unknown, it may be assumed that the frame synchronization is within P bits. Then if the message is not detected during those P bit positions, after an erasure the decoder can look at the next P bit positions until the frame synchronization is found.

SUMMARY OF THE INVENTION

It is a general object of the present invention to provide an improved digital communication system which minimizes transmission time length and decoding time to obtain frame synchronization with convolutional sequential encoding and decoding techniques.

It is a more specific object of the present invention to provide the above-described communication system by combining sync bits and data bits and utilizing a decoder which simultaneously searches for the correct phase and decoded information within P bit positions.

Briefly, according to the invention, an improved digital communication system includes an encoder and decoder for the transmission of digital information over a transmission medium, the system having automatic frame synchronization and data recovery requiring a minimum of transmission bits and decoding time. The encoder processes a data stream and generates a transmission bit stream of N bits using convolutional encoding, autosynchronization sequence combining, and bit interleaving. The multi-phase sequential decoder decodes the received coded data, corrects transmission errors and automatically achieves frame synchronization from selected phases of the received data. This is accomplished by selecting the received data with the best phase, bit de-interleaving, removing the autosynchronization sequence and comparing the received data of the selected phase with the code word subset having the best metric. The decoder then selects a new best metric node and phase in an iterative process until the decoding operation terminates with either valid decoded data upon reaching a terminal node or a code word erasure due to computation or memory overflow. Thus the decoder simultaneously searches for the correct phase and decodes data by iteratively maximizing the code word metric in one decoding operation.

BRIEF DESCRIPTION OF THE DRAWINGS

FIG. 1 illustrates in block form a transmission bit stream comprised of N coded information bits preceded by a separate frame sync sequence of M bits.

FIG. 2 is a block diagram illustrating the method of combining the sync bits and the information bits for short messages where it can be assumed that synchronization will occur within P bit positions.

FIG. 3 is a block diagram illustrating an encoder for encoding and transmitting data bits to be subsequently decoded in accordance with the present invention.

FIG. 6, including

FIG. 7, including

FIG. 8, including

DESCRIPTION OF THE PREFERRED EMBODIMENTS OF THE INVENTION

Figure 4:
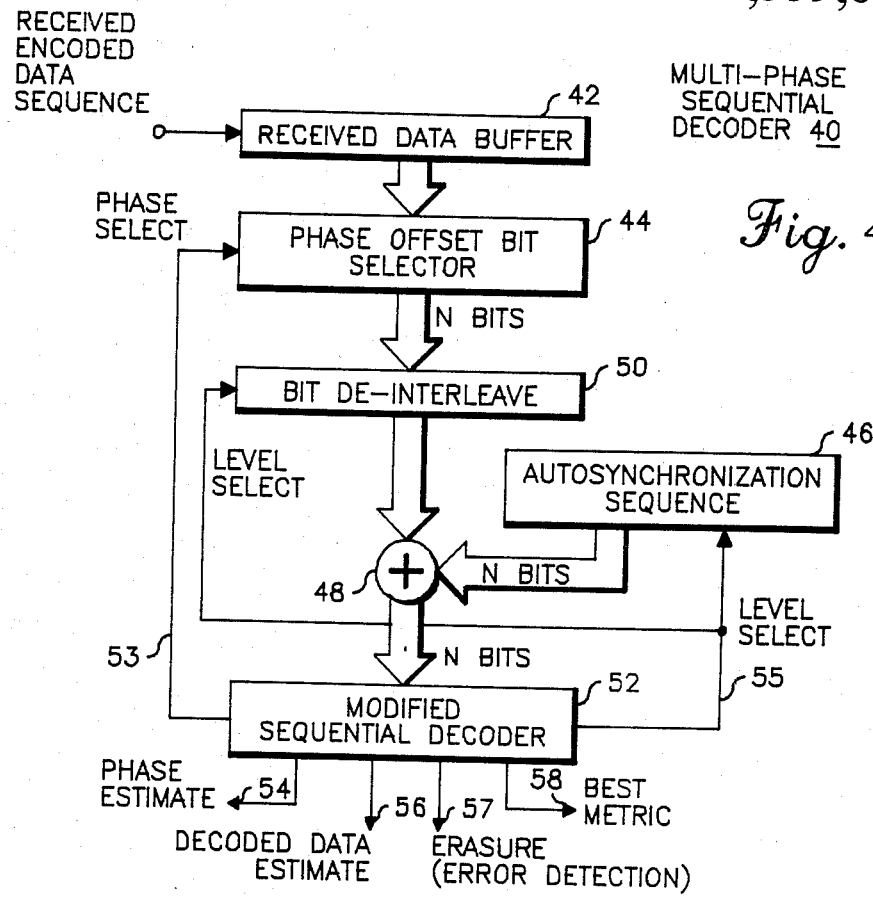
FIG. 4 is a block diagram illustrating the preferred embodiment of the decoder of the present invention for decoding messages of the type received from the encoder shown in FIG. 3.

With reference to FIG. 1, a prior art synchronization encoding scheme is illustrated wherein M sync bits precede the N data bits in a transmission bit stream. The decoder processes the M sync bits to prepare for successful reception of the data bits. As mentioned hereinabove, a basic problem with this prior art synchronization encoding scheme is that the total message bit length equals M+N. A lengthy transmission time is therefore required and the communication efficiency is not good, especially for relatively short data messages.

FIG. 2 illustrates a system wherein the data bits and the sync bits are combined, such as by a modulo 2 adder, so that a decoder, such as a threshold detector, can detect frame synchronization and decode the information. The decoder assumes that when sufficiently few errors have been detected by the threshold detector, encoded information containing the autosynchronization sequence will be synchronized with the stored autosynchronization sequence. Otherwise, if the autosynchronization sequence in the received information was not in phase with the stored autosynchronization sequence, the modulo 2 adder at the decoder would combine different phases of the autosynchronization sequence thereby generating errors. The number of generated errors desired is dependent upon the properties of the chosen convolutional code encoder and decoder. Therefore the autosynchronization sequence should be chosen to provide maximum false code word protection and should generate a selected number of errors and not necessarily the maximum possible number of errors. This is known to the coding theory arts. The present invention utilizes a combining scheme, but instead of using a threshold detector which must detect each phase of received data, a multi-phase sequential decoder is employed to simultaneously resolve the phase and decoded data estimate.

The encoder for generating the encoded bit stream of the present invention is shown in FIG. 3. An input data sequence comprised of K bits is presented to a convolutional encoder 22 which produces an error-correctable code by adding additional parity bits resulting in a total of N bits in the sequence. This sequence is combined with an autosynchronization sequence stored in storage means 26, utilizing a modulo 2 adder 28, which will typically be an exclusive OR gate. These N bits are presented to a bit interleave means 24 which scrambles the information and parity bits to add time diversity so that relatively short burst errors may be corrected at the receiver. This generates a transmission encoded bit stream which is transmitted across the communications channel. Burst error correction coding is taught in U.S. Pat. No. 3,882,457 issued to John En on May 6, 1975 and which is assigned to the assignee of the present invention.

The multi-phase sequential decoder portion, generally designated 40, of the present invention is shown in FIG. 4. The decoder resides at the receiver of the communications system and receives the encoded bit stream including any errors picked up due to noise or disturbances in the communications channel. The received encoded bit stream is presented to a received data buffer 42 which is longer than the number of bits in the stream so that more than one phase can be resolved. Various phases of the received data may be selected by a phase offset bit selector 44. The output of phase offset bit selector 44 is then presented to a bit de-interleave means 50 which removes the interleaving which was impressed at encoder 30 of the transmitter. This effectively converts any burst errors picked up during transmission in the communications channel to random errors. The de-interleaved bits of an assumed phase present at the output of bit de-interleaver 50 are combined with an autosynchronization sequence stored in a storage means 46, such as a read only memory. The autosynchronization sequence in storage means 46 corresponds to the autosynchronization sequence in storage means 26 of encoder 30 (FIG. 3) so that if the correct phase is selected, the combiner 48 will strip off the autosynchronization sequence. This stripping of the autosynchronization sequence occurs since two exclusive OR operations with the same autosynchronization sequence, such as first by combiner 28 in encoder 30 and second by combiner 48 in decoder 40, will yield the convolutionally encoded input data as originally encoded by the convolutional encoder 22 and presented at its output. That is, if the correct phase was selected by phase offset bit selector 44, the output of the combiner 48 should correspond to the output of the convolutional encoder 22 of encoder 30, including any errors picked up in the transmission process. Although it is assumed that the phase is known within P bit positions, if frame sync is not found within P phases, the decoding process may be repeated for other selections of P bits until a successful decode is accomplished.

As previously pointed out, the multiphase sequential decoder includes all of the blocks shown in FIG. 4 and is generally designated by reference numeral 40. Block 52 in FIG. 4 is a modified version of a single-phase sequential decoder. A standard single-phase sequential decoder does not have phase storage means for each node on the stack and does not provide the capability of selecting a phase for obtaining automatic frame synchronization. Furthermore, the standard single-phase sequential decoder does not provide a means for placing P initial nodes on the stack with different phase values. Accordingly, a single-phase sequential decoder does not have a phase estimate output 54 or a phase select output 53.

The phase select output 53 from modified sequential decoder 52 is provided as an input to phase offset bit selector 44 to select the phase of the received data to be processed by the decoder 40. The value of the phase select output is the phase of the node on the stack with the best metric. The level select output 55 from decoder 52 is provided as an input to bit de-interleaver 50 and autosynchronization sequence 46 to indicate the level in the code tree of the node on the stack with the best metric. The level select output selects certain bits of the received data for combination with certain corresponding bits of the autosynchronization sequence for input to the modified sequential decoder 52.

Phase estimate 54, decoded data estimate 56, erasure 57 and best metric 58 are all output from decoder 52 to an external user device (not shown), for example, any device which requires communication over a digital transmission medium. Decoded data estimate output 56 provides the error-corrected and frame-synchronized decoded code word. Phase estimate output 54 indicates the phase at which the decoded data estimate 56 was successfully decoded. This can be used to improve future decoding attempts by dynamically changing the number of phases P and/or the position of the P phases in time or space. Best metric output 58 indicates the code word metric of the decoded data estimate 56 and may be used as a quality indicator/confidence level for the validity of the output code word. The external user device could ignore output code words whose best metric falls below some predetermined quality threshold. This method provides additional false code word protection (error detection). Erasure output 57 indicates that decoder 40 has failed to decode the code word and that no decoded data is available on outputs 54, 56 or 58. This decoding failure may be due to computation time limitations or stack memory overflow. Thus erasure output 57 provides false code word protection (error detection) by erasing those decoding attempts which are unlikely to be successful.

In accordance with one aspect of the present invention, phase selection of P bit positions is incorporated into the multi-phase sequential convolutional decoder 40 so that the sequential convolutional decoding procedure for a given phase is terminated at an early point in the decoding process when it appears that the given phase is generating more errors than are being generated in other phases. The P bit positions are less than the N bit length of the transmitted messages and are selected to be within that portion of the N bit stream where synchronization is anticipated. Thus, the multi-phase sequential decoder 40 can quickly locate the phase which results in synchronization.

The foregoing discussion of P phases refers to different frame synchronization points in time. However, the P phases would also have application to space diversity or combinations of space and time diversity. An example of the combination of space and time diversity would be in a simulcast receiver system. In this example, several phases would be allocated to each receiver site in the simulcast system and the multi-phase sequential decoder would resolve the received code word with the highest probability of being a valid code word, regardless of receiver site location or time delays between receiver sites.

Figure 5:
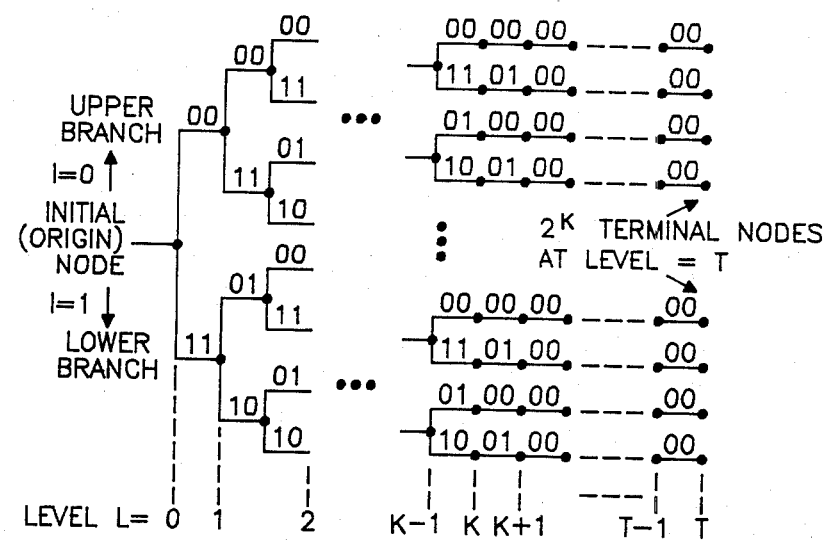
FIG. 5 diagrammatically illustrates a binary code tree for a rate one-half convolutional code and further shows the steps used by the sequential decoder of the present invention in decoding a convolutional code.

A binary code tree is illustrated in FIG. 5 for a rate one-half convolutional code that diagrammatically illustrates the operation of the sequential convolutional decoder. The code tree is one way of tabulating a convolutional code. The convolutional code may be defined as a function which generates a sequence of output bits, given a sequence of input bits, for which the output bits are a function of some fixed number of previous input bits. An input bit sequence corresponds to a path through the tree from the initial node, $L=0$, to a terminal node, $L=T$. Each node at a depth L branches up or down if the input bit at the node of interest is a 0 or 1, respectively. The output bits for the path are listed on the corresponding branches, from left to right. The sequential decoder tries to find the best path, or estimated input bit sequence, given a coded data input sequence which may not correspond directly to a code word, or sequence of output bits, due to errors as from noise, or, in the case of an autosynchronization system, from the selection of the wrong phase. The best path through the binary code tree is found by comparing the code word of each possible path to the coded sequence and by selecting the code word which differs by the least number of bits. Unfortunately, this requires a large number of calculations which increases exponentially as 2 to the K'th power.

The sequential decoder of the present invention avoids the massive number of calculations to arrive at a good estimate of the best path by constructing a path starting from the initial node and extending the path to other nodes. This is known as tree searching. Each time the path is extended to another node, the output bits along the branches, generated by a convolutional encoder in the sequential decoder, are compared to the corresponding coded data input bits, and a comparison is stored as a parameter called the metric. The metric is thus a measure or indicator that the probability that the path from the initial node to another node, called a partial path, is along the best path. For the rate one-half code corresponding to the code tree in FIG. 5, the difference in metrics between any two connecting nodes will, in the preferred embodiment, typically be plus 1 for each bit along the corresponding branch which is in coincidence with the corresponding coded data input bit, and minus 9 if the bit is not in coincidence. In finding the best path through the code tree in FIG. 5, the searching process accomplishes error correction by finding the path with the largest metric. Since the path metric is the sum of the individual branch metrics, the search process as implemented by the decoder will select individual branches with received data bit errors having low branch metrics in order to find the complete path with the largest metric.

Sequential decoding results in the saving of computation time because only the node with the best metric is extended to the next connecting nodes, regardless of the assumed phase. Storage space for the best node is no longer needed and may be reused for the extended nodes at this time. The decoding process terminates when a terminal node is reached. If the signal-to-noise ratio is high, the best path is rapidly extended from the initial to the terminal node.

Figure 6A:
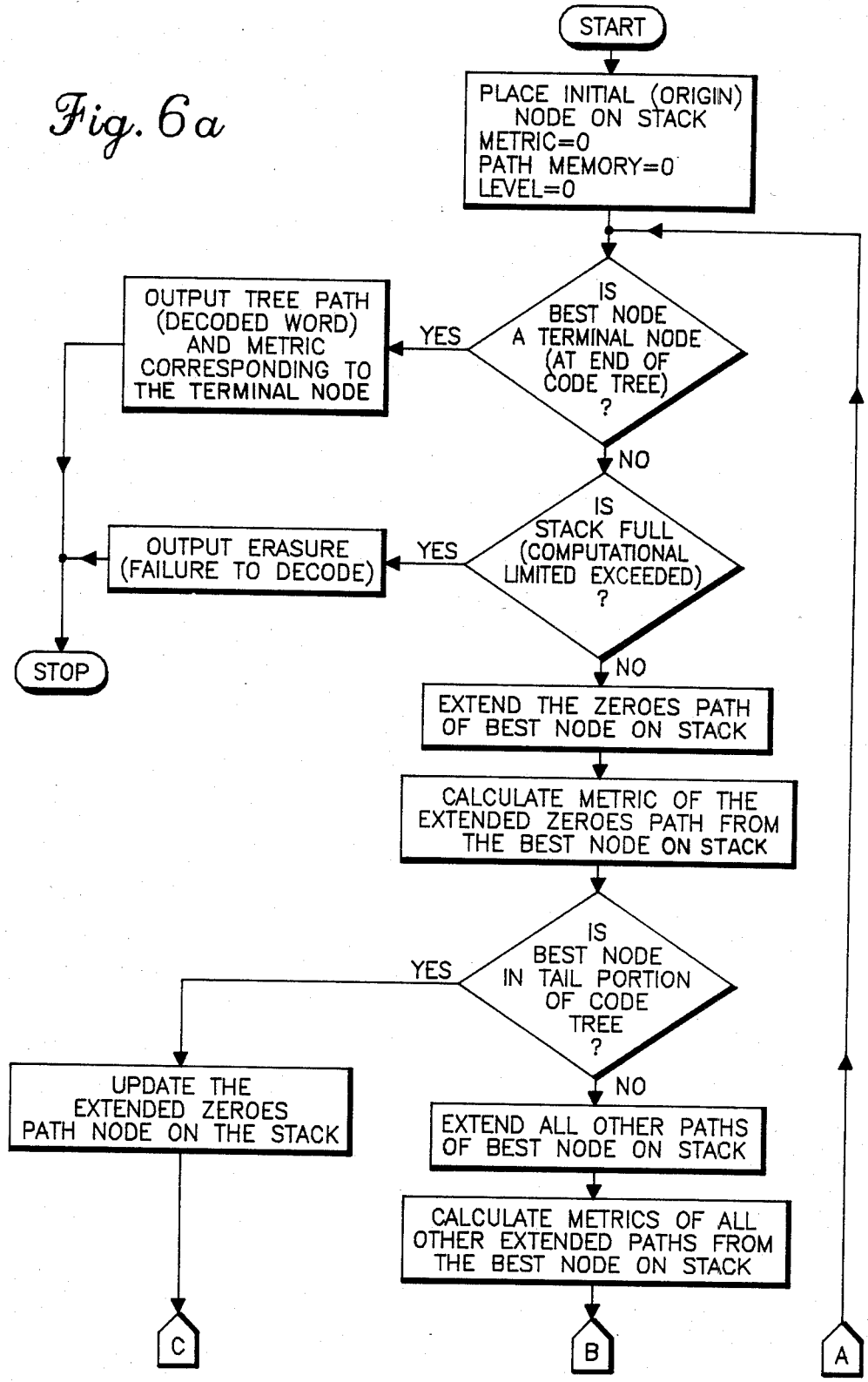
FIGS. 6A and 6B, is a flow chart illustrating the sequential decoder stack procedure utilized in a single-phase sequential decoding operation.
Figure 6B:
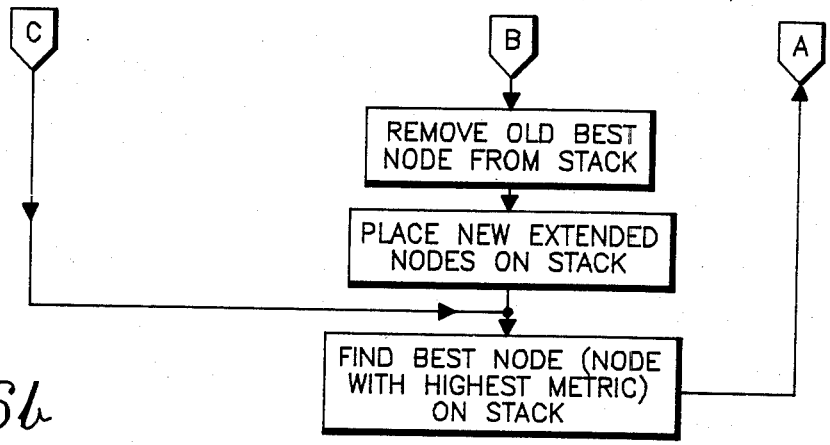

The preferred implementation of a sequential decoder operates on a stack of memory by means of a microprocessor or the like according to the flow chart shown in FIG. 6, which includes FIGS. 6A and 6B. The stack is a list of memory blocks containing storage for the metric of a node, the level of the node and the estimated data bits corresponding to the partial path to the node. In practice, it is desirable to have on hand much less memory than is necessary to store data for all of the possible partial paths since full capacity is needed only if the signal-to-noise ratio is very poor. When this condition occurs, it is advantageous to terminate the decoding process, resulting in an "erasure." It should be noted that like memory, maximum computing time is also required for low signal-to-noise conditions.

Figure 7A:
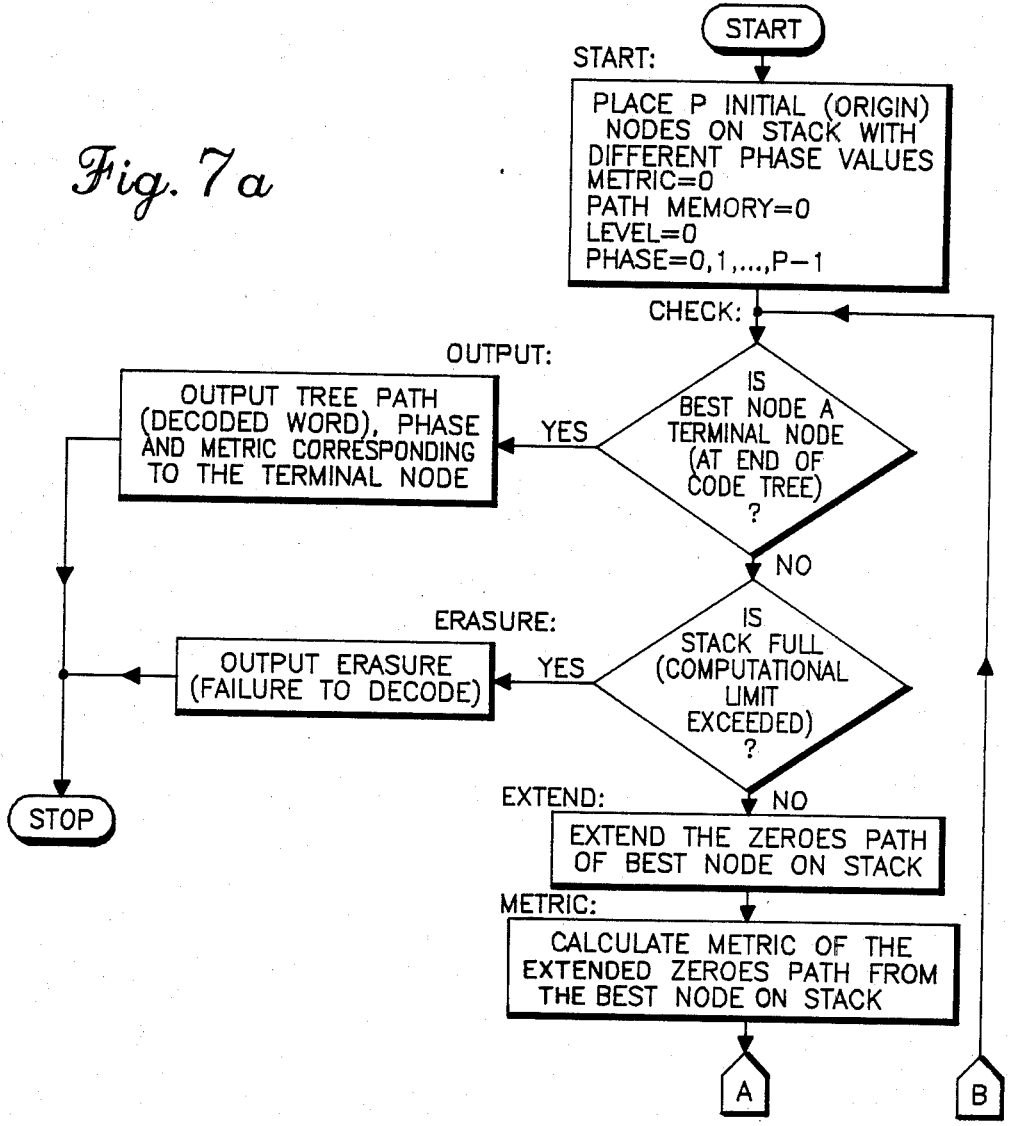
FIGS. 7A and 7B, is a flow chart illustrating a multi-phase sequential decoding procedure which is preferred over the single-phase sequential decoding stack procedure shown in FIG. 6.
Figure 7B:
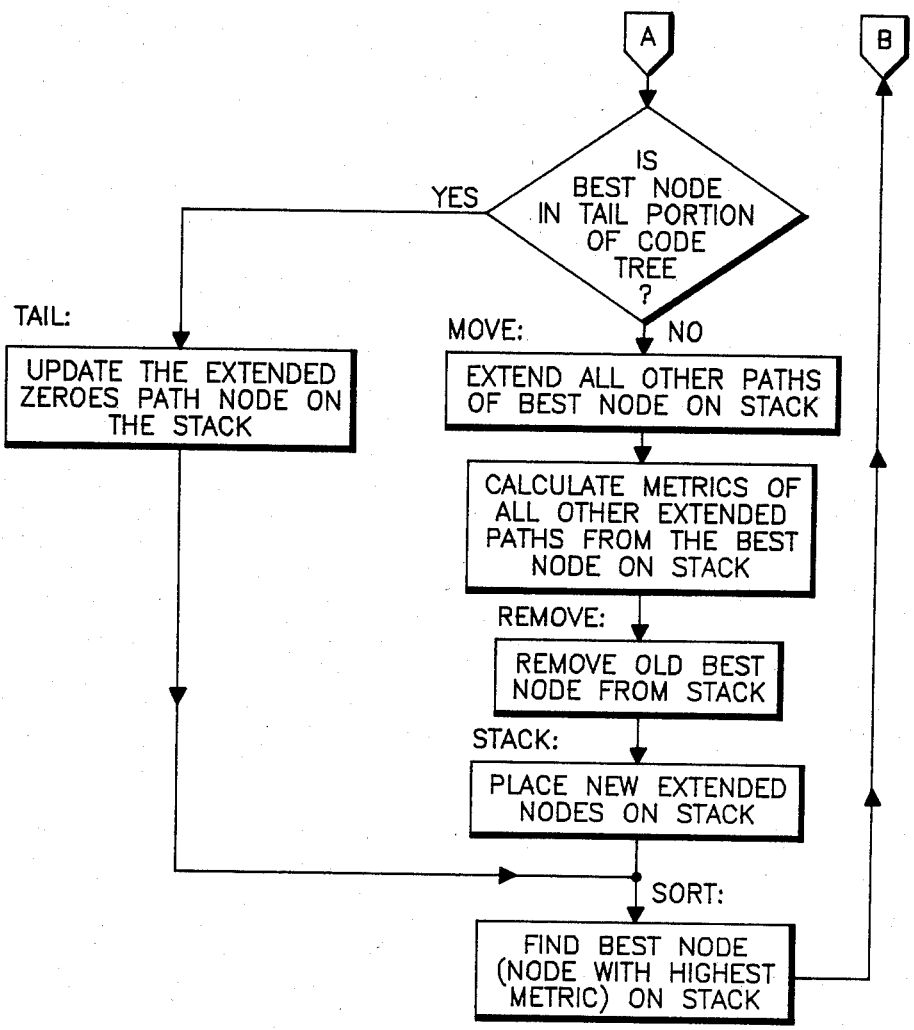

Once the operation of a sequential decoder is understood, the operation of an improved multi-phase sequential decoder having greatly decreased computation time may more readily be understood. A typical prior art multi-phase sequential decoder required a complete decoding operation for each assumed phase. This had the disadvantage that most of the phases would be incorrect, resulting in erasures and thus requiring maximum computational time and large amounts of data storage space. The improved multiphase sequential decoder of the present invention operates on all phases simultaneously, rather than estimating the best complete path for each of N phases before making a relative comparison among all phases. The binary code tree is thus considered as having P-distinct "trunks" with an initial node on each trunk. The decoder starts with these P initial nodes, and the memory space for each node in the stack includes a corresponding memory location for the phase corresponding to one of the P nodes. This is illustrated in the flowchart of FIG. 7 which includes FIGS. 7A and 7B.

It might be thought that increasing the size of the effective code tree by a factor of P would require correspondingly additional memory space for operation in noisy conditions. In practice this is not the case, since required memory size is not a linear function of the maximum number of possible partial paths. Required memory size, and required computation time, are determined by the probability of estimating a complete path without erasure and the minimum size message to decode a word. This probability is increased by the present invention, since it is likely that one of the P phases will be much better than the rest, while for some of the individual phases it is likely that erasures will occur.

The listing of the individual steps corresponding to the flow chart in FIG. 7 is shown in Table 1, below, and should now be self-explanatory to those skilled in the art. These steps may be directly implemented in programming language or microprocessor operations, and executed in a stored program computing machine. However, there are a few steps in the procedure, notably the selection of the best metric, that require a majority of the computing time and which may therefore limit direct microprocessor implementation for many real time processing applications. In these cases a hardware or hybrid system comprised of hardware registers and logic for stack manipulation and metric selection, and control logic or a microprocessor for system control, such as that illustrated in FIG. 8, may be utilized.

TABLE 1

STEPS FOR AUTOMATIC FRAME SYNCHRONIZING DECODER
EMPLOYING A MULTI-PHASE SEQUENTIAL DECODER
"*" DENOTES COMMENTS

```
*   AUTOMATIC FRAME SYNCHRONIZATION SEQUENTIAL DECODER
*   FOR RATE ONE-HALF CONVOLUTIONAL CODE
*
*   PROGRAM ENTRY LABEL
*   START
*   PROGRAM EXIT LABELS
*   OUTPUT - OUTPUT DECODED WORD, PHASE AND METRIC
*   TO USER DEVICE
*   ERASURE - OUTPUT CODEWORD ERASURE TO USER DEVICE
*
*   PREDEFINED VARIABLES
*   P                       NUMBER OF PHASES
*   K                       NUMBER OF INFORMATION BITS PER
*                           CODEWORD
*   LMAX                    MAXIMUM TREE LEVEL AT TERMINAL
*                           NODE
*   JMAX                    MAXIMUM STACK SIZE LIMIT
*
*   BUFFER ( )              RECEIVED DATA BUFFER ARRAY
*
*   STACK ARRAYS
*   METRIC (J)              METRIC OF JTH NODE IN STACK
*   LEVEL (J)               LEVEL OF JTH NODE IN STACK
*   PHASE (J)               PHASE OF JTH NODE IN STACK
*   PATH (J,L)              BINARY ARRAY OF JTH CODE TREE PATH
*                           TO THE LTH LEVEL IN CODE TREE
*   STACK HANDLING VARIABLES
*
    BEST    BEST NODE       STACK INDEX
*   J                       CURRENT STACK SIZE
*   TJ                      TEMPORARY STACK SIZE
*   L                       BEST NODE LEVEL
*   TL                      TEMPORARY LEVEL STORAGE
*   MZERO                   ZERO PATH METRIC
*   MONE                    ONES PATH METRIC
*   TM                      TEMPORARY METRIC STORAGE
*
*   OTHER VARIABLES
*
*   TP                      TEMPORARY PHASE STORAGE
*   T1,T2,T3,T4             LEVEL ADDRESSING STORAGE
*   RBIT1                   FIRST BIT OF RECEIVED DATA BRANCH
*   RBIT2                   SECOND BIT OF RECEIVED DATA
*                           BRANCH
*   BIT1                    FIRST BIT OF CODE TREE BRANCH
*   BIT2                    SECOND BIT OF CODE TREE BRANCH
*
*   TABLES
*   AUTOSEQ(I)              BINARY AUTOSYNCHRONIZATION
*                           SEQUENCE
```

TABLE 1-continued
STEPS FOR AUTOMATIC FRAME SYNCHRONIZING DECODER EMPLOYING A MULTI-PHASE SEQUENTIAL DECODER
"*" DENOTES COMMENTS

```
*                               ITH BIT, 1<I>N
*      FUNCTIONS
*      CONENC(1,J,L)            RETURNS FIRST BRANCH BIT
*      CONENC(2,J,L,)           RETURNS SECOND BRANCH BIT
*                               CONENC IS A CONVOLUTIONAL ENCODER
*                               FUNCTION WHICH GENERATES THE CODE
*                               TREE BRANCH BITS BY USING INPUT
*                               BITS PATH(J,L) WITH CONVOLUTIONAL
*                               CODE GENERATOR POLYNOMIAL G₁(X)
*                               OR G₂(X).
*
*      DEINT(I)                 DE-INTERLEAVE FUNCTION RETURNS
*                               NEW BIT POSITION FOR INPUT
*                               POSITION I, 1<I<N. FOR EX-
*                               AMPLE, TYPICALLY N=4M, WHERE M
*                               IS AN INTEGER AND;
       Q = INT(I/M)             INTEGER QUOTIENT; Q=0, 1, 2,
*                               OR 3
*      R = I−QM                 INTEGER REMAINDER; R=0, 1,
*                                 ..., M−1
*      DEINT(I) = 4R+Q
*      METCALC (BIT,RBIT)       RETURNS METRIC CHANGE IF (BIT ≠
*                               RBIT) METCALC (BIT,RBIT)= −9
*                               −9 IF CODE BIT ≠ RECEIVED BIT
*                               IF(BIT=RBIT),METCALC(BIT,RBIT)=1
*                               1 IF CODE BIT = RECEIVED BIT
*
*      EXOR(X,Y)                RETURNS THE EXCLUSIVE OR
*                               LOGICAL FUNCTION OF TWO BINARY
*                               VARIABLES
*
START: J = 0
       TP = 0
       BEST = 1
S1:    J = J + 1
       METRIC(J) = 0            INITIALIZE P NODES ON STACK
       LEVEL (J) = 0            WITH DIFFERENT PHASE VALUES
       PHASE (J) = TP
       PATH (J,1)= 0
       TP = TP + 1
       IF (TP<P) GO TO S1
*
CHECK: IF (LEVEL (BEST) = LMAX) GO TO OUTPUT
       IF (J = JMAX) GO TO ERASURE
EXTEND: L = LEVEL (BEST)
       TL= L + 1                EXTEND THE ZEROS PATH
       PATH (BEST,TL) = 0       OF BEST NODE ON STACK
METRIC: T1 = 2L
       T2 = T1 + 1
       T3 = DEINT(T1)           GET RECEIVED BRANCH
       T4 = DEINT(T2)           BITS ACCORDING TO LEVEL
       T3 = T3 + PHASE(BEST)    AND PHASE
       T4 = T4 + PHASE(BEST)
       RBIT1 = BUFFER(T3)
       RBIT2 = BUFFER(T4)
       RBIT1 = EXOR(RBIT1,AUTOSEQ(T1 + 1)) REMOVE AUTO-
       RBIT2 = EXOR(RBIT2,AUTOSEQ(T2 + 1)) SYNC SEQUENCE
       BIT1 = CONENC(1,BEST,TL) GET CODE TREE BITS
       BIT2 = CONENC(2,BEST,TL) ACCORDING TO LEVEL
       MZERO = METRIC(BEST)  + METCALC(BIT1,RBIT1)   CALCULATE
                             + METCALC(BIT2,RBIT2)   ZERO BRANCH
                                                     METRIC
       IF(TL<K) GO TO MOVE
TAIL:  METRIC (BEST) = MZERO
       LEVEL (BEST) = TL
       GO TO SORT
MOVE:  L = 1
       J = J + 1                MOVE PATH MEMORY TO
M1:    PATH(J,L) = PATH(BEST,L) ONES PATH NODE
       IF(L<TL) GO TO M1
       PATH(J,TL) = 1
       BIT1 = CONENC(1,J,TL)
       BIT2 = CONENC(2,J,TL)
       MONE = METRIC(BEST)   + METCALC (BIT1,RBIT1)
                             + METCALC (BIT2,RBIT2)
REMOVE: METRIC (BEST) = MZERO
       LEVEL (BEST) = TL
STACK: METRIC(J) = MONE
       LEVEL(J) = TL
```

TABLE 1-continued
STEPS FOR AUTOMATIC FRAME SYNCHRONIZING DECODER
EMPLOYING A MULTI-PHASE SEQUENTIAL DECODER
"*" DENOTES COMMENTS

```
            PHASE(J) = PHASE(BEST)
SORT:       TJ = J
            BEST = J
            TM = METRIC(BEST)
S1:         TJ = TJ−1
            IF(TJ=0) GO TO CHECK
            IF(METRIC(TJ)<TM) GO TO S1
            BEST = TJ
            TM = METRIC(TJ)
            GO TO S1
```

Figure 8A:
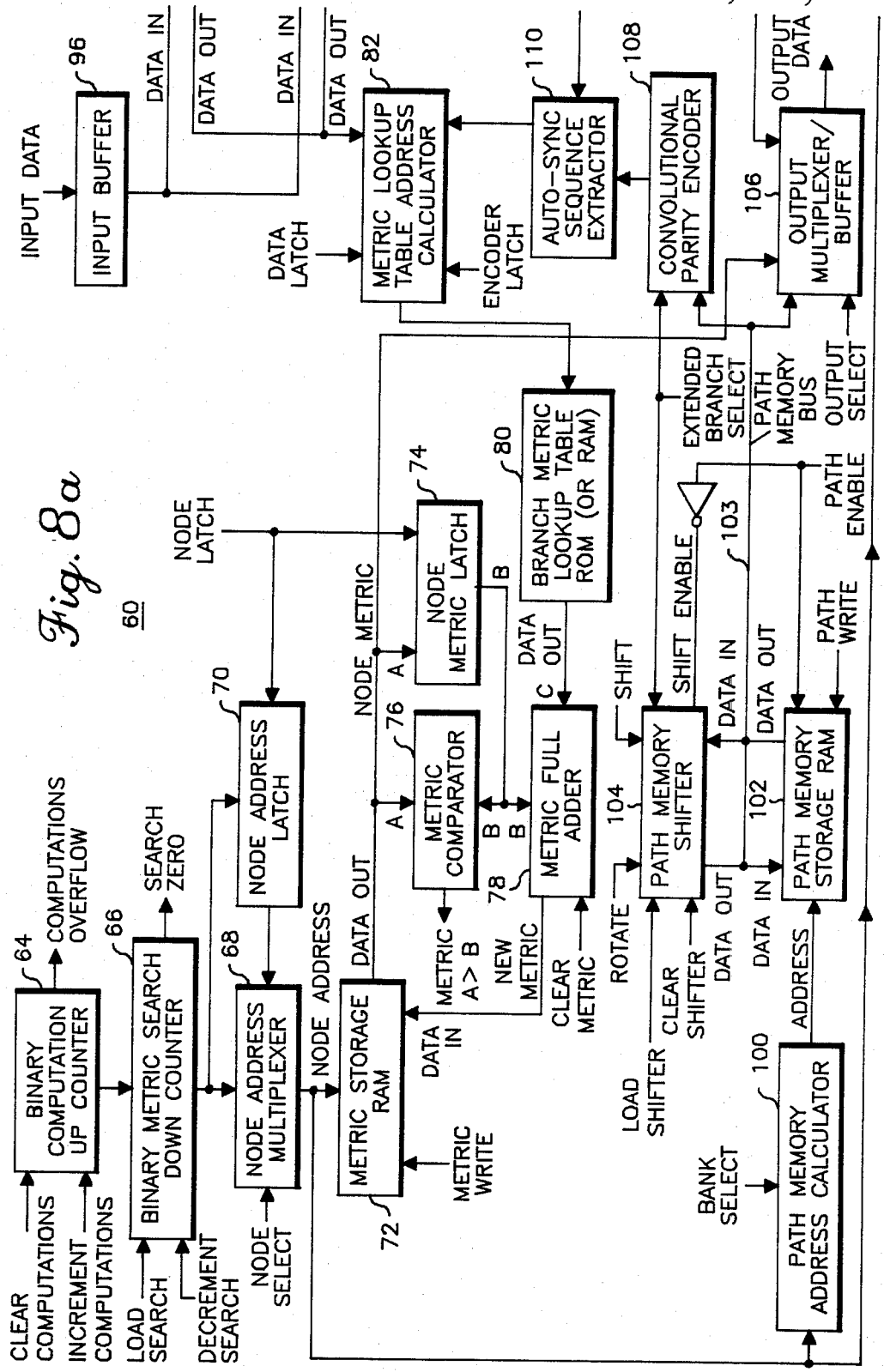
FIGS. 8A, 8B and 8C, is a diagram, partially in schematic form and partially in block form, illustrating a multi-phase sequential decoder circuit in accordance with the present invention.
Figure 8B:
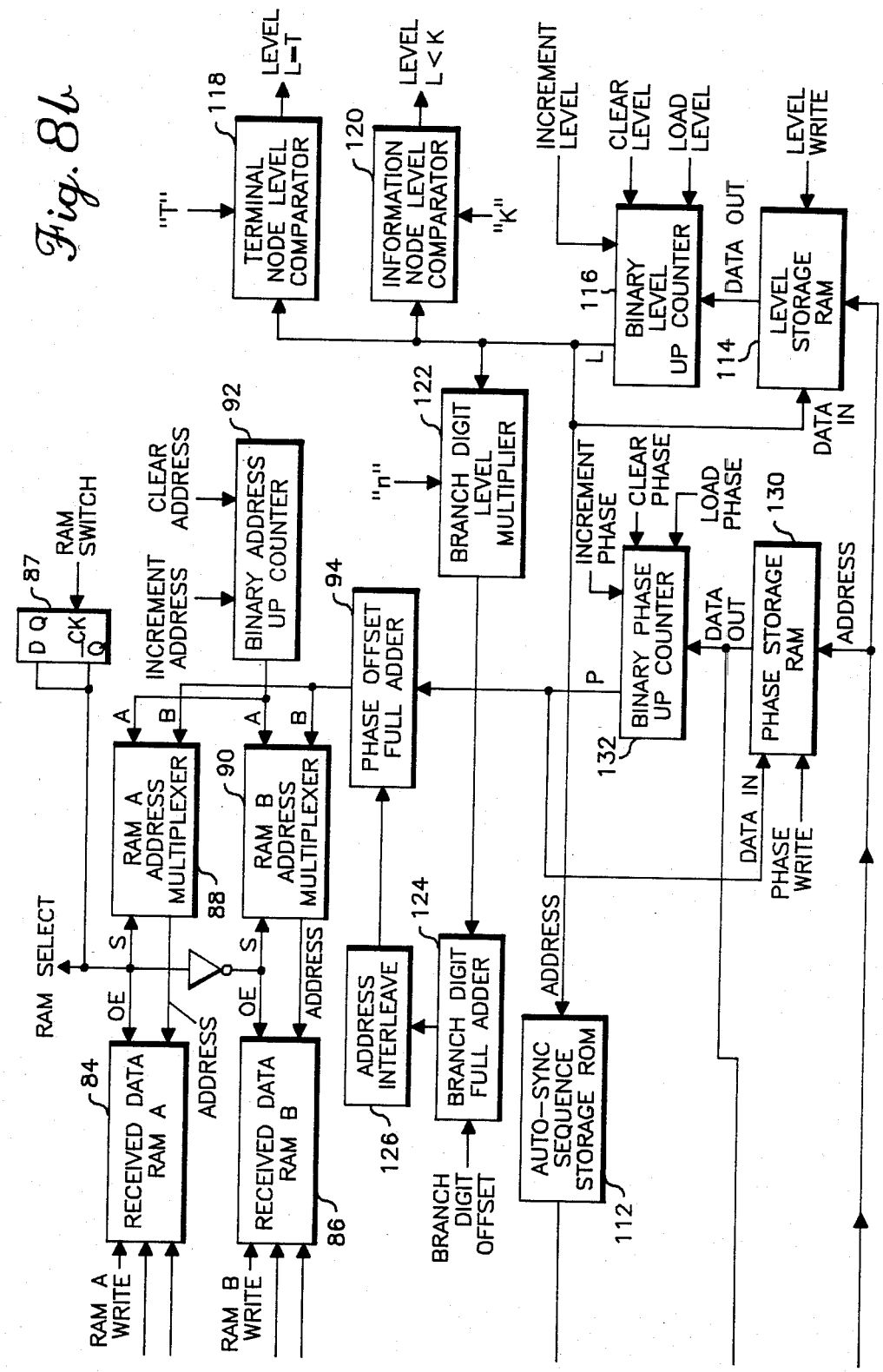
Figure 8C:
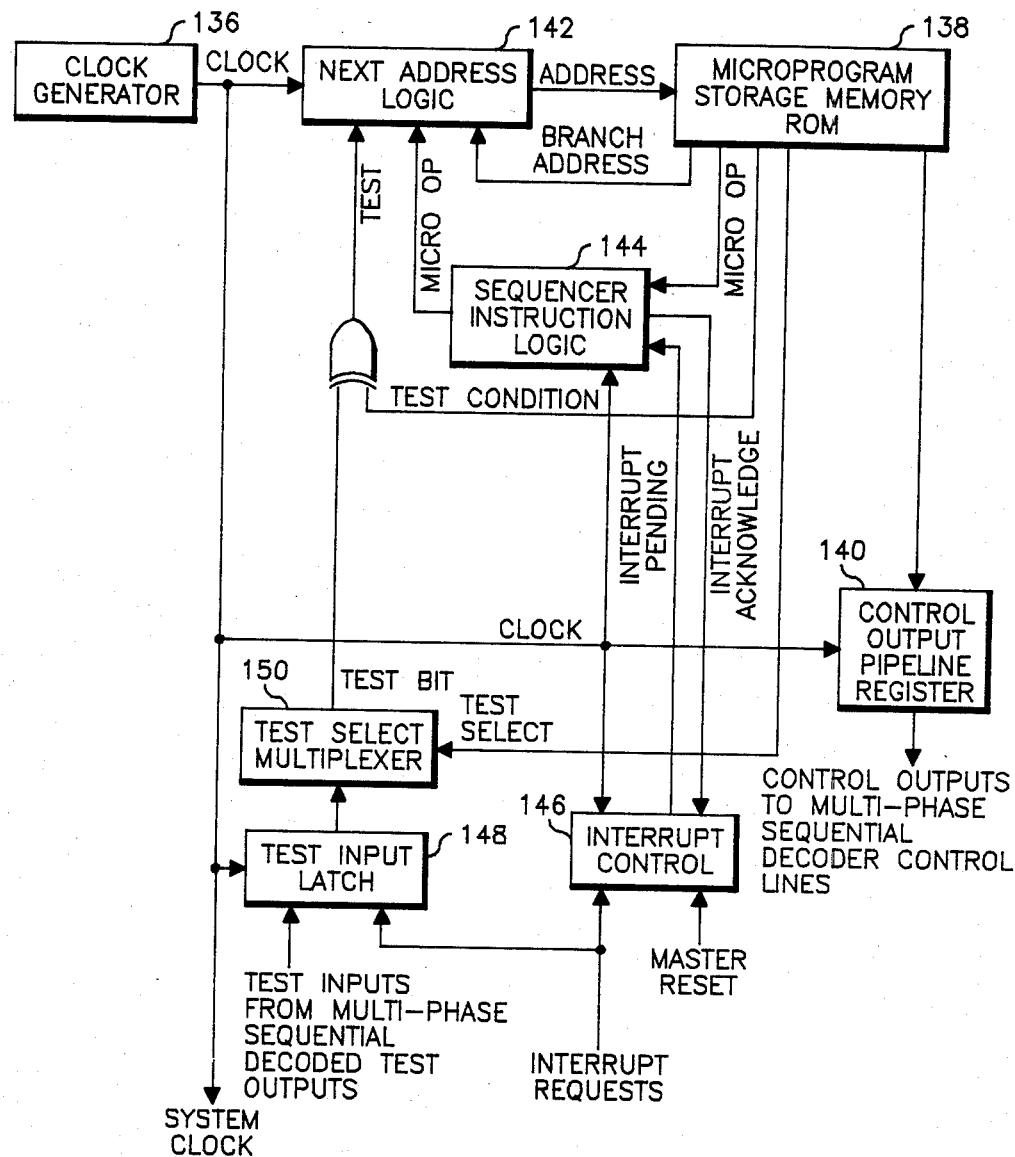

A hardware embodiment of an automatic frame synchronization multi-phase sequential decoder, generally designated 60, corresponding to the decoder illustrated in the flow chart of FIG. 7, is shown in FIG. 8, including FIGS. 8A, 8B and 8C. The controller, generally designated 62 in FIG. 8C, controls the hardware of FIGS. 8A and 8B. The controller sequences through a series of hardware control steps which are stored in a memory means ROM 138. Such an arrangement is commonly known as a microprogram sequencer. Its implementation and variations thereof are well known to those skilled in the computer design arts.

The flowchart of FIG. 7 is implemented in the hardware of FIG. 8 by asserting combinations of control lines in the proper order and testing the proper test lines as required to conditionally change the order in which the operations are carried out. The function of each block will now be described.

A binary computation up counter 64 has a value equal to the number of nodes on the stack minus 1 (since zero is a location on the stack). This counter determines the number of nodes to be searched when a search for the best node (node with highest metric) is performed. It is initially cleared at the start of a word decoding operation and is incremented each time a new node is to be placed on the stack. The width of this counter is C bits. The maximum number of nodes is $2^C$ and must be greater than T. The actual value of C is determined by the incoming signal to noise ratio and the decoder performance specifications. Each node has a unique address. Each unique node can be accessed by the C bit wide address passed from binary computation up counter 64 to binary search down counter 66 and from node address multiplexer 68 to metric storage RAM 72. When counter 64 reaches its maximum value ($2^C-1$), the last location or node on the stack has been reached and no new nodes may be added to the stack after the current node. The stack is now full and the computations overflow test line is asserted. The microprogram sequence controller may test this line and branch to output a decoded word erasure for this condition.

A metric search down counter 66 is a down counter which is loaded with the address of the first node to search when performing a search for the best node. By design, the nodes are stored in consecutive ascending addresses in memory means so that counting down from the "first node to search" value to the value zero will search all nodes currently on the stack. Consequently, counter 66 should also be at least C bits wide to accept any value from the binary computation up counter 64. The value loaded will actually be the address of the most recent node to have been put on the stack, which is equivalent to the total number of nodes currently on the stack minus 1. The counter is decremented as the search for the best node is performed, allowing each node on the stack to be compared to the best node found thus far in the search. When the last node to be searched has been compared, the counter will have the value of zero and the controller may perform a conditional branch on the search zero test line to terminate the search for the best node.

A node address multiplexer 68 determines which source is used as the address to access a node on the stack. During the best node search, the output of the metric search down counter 66 is routed through multiplexer 68 as the address for selecting a node on the stack. When the best node is being accessed for path extension, metric calculation, etc., a node address latch 70 is selected as the source of the address for accessing the best node in the stack. This multiplexer 68 should be C bits wide to allow access to all $2^C$ nodes on the stack.

The node address latch 70 stores the address of the best node (node with the highest metric) so that the best node may be easily accessed on the stack. During the best metric search operation, the value of latch 70 is the address of the best node found thus far in the search. During the search operation the latch 70 is initialized to the address of the node most recently put on the stack. This is the value of the metric search down counter 66 at the start of the search operation. Thus the first node accessed in the search operation is always selected as the current "best node" and its address latched into the node address latch 70. This value is then replaced by the address of the node with the highest metric as the best node search continues. So the address of the current best node will be updated until the search is complete, whereupon the value latched in the node address latch 70 will be the best node since all nodes have been searched. This latch should also be C bits wide to be able to store any of the $2^C$ node addresses. This method assumes an unordered stack and must search the entire stack to find the best node. An alternative method, useful for microprocessor implementations, is to maintain an ordered stack based on the metric value. Since the best node is always at the top of the stack, no searching is then required. However, when new nodes are added to the stack, it must be sorted to maintain proper stack ordering.

A metric storage RAM 72 provides storage for the metrics of all nodes on the stack. The metric of a particular node on the stack is accessed by supplying the address of that node to the metric RAM 72. The metric for that node appears on the data out lines from RAM 72. Metrics for a particular node may be written into the metric storage RAM 72 by supplying the node address, the metric value to the data in lines and asserting the metric write control line. The metrics are stored in standard 2's complement binary representation. The width of the metric storage RAM should be wide enough to store the maximum range of the metric value expected, say D bits wide. This can be calculated once the maximum and minimum metric values per bit comparison and the maximum number of received data bits are known for a particular application. The number of addressable locations required for the metric storage RAM 72 must be at least enough to reach the terminal node of the tree.

A node metric latch 74 stores the metric of the best node for comparison with the metrics of other nodes and also for computation of new metrics for extended nodes. This value is the metric present on the data out lines of the metric storage RAM 72 when the node latch control line is asserted. The metric latch always contains the metric of the node whose address is stored in the node address latch 70 discussed previously. During the best metric search operation, the latch 74 is initialized to the value of the metric most recently put on the stack. Thus the current best metric is stored for comparison with other metrics as the search for the best node continues. After the search is complete, the metric of the best node (node with the highest metric) will be present in the metric latch 74. Since any value of metric could be stored in the latch, it should be D bits wide.

A metric comparator 76 is a 2's complement binary comparator and is used by the best node search operation to determine whether the search node metric present at input A is greater than the current best node metric present at input B. If this is true, the test line metric $A > B$ is asserted and the controller will latch the new current best node (highest metric) into the node address latch 70 and the metric latch 74 by asserting the node latch control line. Then the higher metric previously present at input A will be present now at input B and the comparator will search for a yet higher metric. Since this comparator is comparing 2's complement metrics, the metric comparator 76 should be D bits wide.

A metric full adder 78 is a 2's complement signed adder and it calculates the metric of any extended nodes to be added to the stack. The best node metric present at input B is added to the extended branch metric present at input C to form the new metric of the node at the end of the extended branch. This new extended node metric may then be stored in the metric storage RAM 72. For metric initialization purposes, a clear metric control line may be asserted to force the output of the metric full adder 78 to zero. Thus, initial (origin) nodes placed on the stack may have their metrics initialized to zero. The width of input B should be D bits to represent any valid metric, as should the output of the full adder be D bits wide. The input C should be of a width (say R bits) sufficient to represent (in 2's complement binary form) the maximum range of branch metric expected. This can be calculated once the maximum and minimum metric values per bit comparison and the number of received bits per branch is known for a particular application.

A branch metric lookup table ROM 80 is a lookup table containing the 2's complement representation of the metric for an extended branch. The output of the lookup table should be R bits wide as mentioned previously. The input to the lookup table identifies the branch comparison being made by supplying an address which has a one-to-one correspondence to the values of the encoder branch bits and the received branch data.

In the simplest form, the input address is a concatenation of the received branch data (which may be several soft-quantized Q bit binary numbers) and the encoder branch bits (which will typically be several 1 bit binary digits). So the width of the input address field to the lookup table depends on the number of digits per branch in the code tree (n bits) and the level of soft quantization used for the received data (Q bits gives $2^Q$ quantization levels). Total width would be $n(Q+1)$ bits.

A metric lookup table address calculator 82 forms the address for the branch metric lookup table ROM 80 from the bits of the received branch data and encoder branch data for a particular code tree branch that is being extended. The received branch data input will be Q bits wide as discussed previously and each soft quantized received branch digit will be latched by asserting the data latch control line. The encoder branch data input will be n bits wide and will latch the entire encoder branch data by asserting the encoder latch control line. Thus the received branch data appears at the input in serial form (N separate digits, Q bits wide), while the encoder branch data appears at the input in parallel form (N digits combined to form one N bit wide quantity). The address calculator generally combines the bits by concatenating the lines to form a parallel address, although other techniques are possible.

A received data RAM A and RAM B, 84 and 86, respectively, store the received data (Q bits wide) in a double-buffered arrangement. That is, while one RAM is receiving data from the data channel via the input buffer 96, the other RAM is being read by the decoding hardware and a decoding operation is being performed concurrently. Thus, decoding one codeword and receiving the next codeword from the channel can be done simultaneously, improving the effective throughput of the decoder. This technique is known to those skilled in the digital arts. An alternative method allowing concurrent decoding and data reception would replace these elements with a dual-address port-circular buffer RAM such that both the current message and future messages would be stored circularly in the same RAM area. This would be effectively a sliding "window" that stores a portion of the received data from the channel. As each received datum is entered into the buffer, the time window slides forward in time by one bit. This technique is necessary to implement an automatic frame synchronization sequential decoder which searches continuously for messages by performing a P-phase decoding attempt, then moving forward P bits in time and performing another P phase decode attempt, as mentioned previously. Since this modification requires substantially more complex hardware than the approach shown, it is usually more economical to implement the above discussed "continuous-phase" sequential decoder techniques in a stored program (software) microprocessor implementation.

The double-buffer RAM's 84, 86 store successive channel data in increasing address adjacent locations in the RAM's. Thus the RAM contains a "snapshot" of the received data channel. Since the channel data has been interleaved to provide protection against burst errors, the received data is stored in the received data RAM 84, 86 in interleaved form. Thus the decoder must present interleaved addresses to the received data RAM to access the proper branch digit for the code tree comparison. The decoder itself must search the tree in a linear (non-interleaved) fashion.

The width of the RAM's 84, 86 is Q bits, to store the soft (or hard) quantized received data. The data input and data output paths should both be Q bits wide. Write input control lines, RAM A write and RAM B write, are provided to control writing the contents present on the data input lines into the selected RAM 84, 86 at the selected address. Only one RAM will be written into at a time and the other RAM will be read from at that time. The RAM select control line determines which RAM's data output lines are activated. The address inputs must be wide enough to uniquely address each received datum of interest, namely nT+P received digits. So A=[$\log_2$(nT+P)] address bits would be needed, where the value of A is rounded up to next higher integer.

The RAM select flip-flop 87 is a D-type one-bit flip-flop which determines operating mode of received data RAM's A and B, 84 and 86, respectively. The output of the RAM select flip-flop 87 is the RAM select signal which places one RAM 84 or 86 in the input (write) mode under the control of the binary address up counter 92 while placing the other RAM in the output (read) mode under the control of the sequential decoder address generation hardware 94, 126, 124, 122. The flip-flop state is selected by the RAM switch control line input which toggles the flip-flop to its opposite state. That is, each assertion of the RAM switch control line selects the opposite RAM for data input. The RAM switch control line is asserted when an input sync interrupt from the input channel device occurs, indicating that a new received data code word is pending.

RAM A and B address multiplexers 88 and 90, respectively, switch the double-buffer received data RAM's 84, 86 between one of two sources—the input section and the decoder section. Under control of the RAM select line, one RAM will receive addresses from the binary address up counter 92 and the other RAM will receive addresses from the phase offset full adder 94. When a particular RAM is receiving addresses from the decoding section of the hardware, its OE line will enable its data output lines to send data to the metric look up table address calculator 82. All input and output address paths for the multiplexers 88 and 90 are A bits wide. The inverter selects one RAM or the other for the OE signal and also for the address select S signal via the RAM select line.

A binary address up counter 92 determines the address in the received data RAM A or B 88, 90 in which the received data from an input buffer 96 will be written into the RAM. This counter is A bits wide. When one of the received data RAM's is beginning to receive new input data (just after the double-buffering switches the functions of RAM's A and B via the RAM select line), counter 92 is cleared to a value of zero by asserting the clear address control line. Thus the first received data is stored in address zero of the selected RAM. After each datum is stored in the RAM address, the counter is incremented via the increment address control line to point to the next sequential memory location. Thus successive received data samples from the channel are stored in adjacent increasing memory locations in the selected RAM.

An input buffer 96 provides the interface between the input data from the channel and the data input lines of the received data RAM'S A and B. The width of the buffer is Q bits.

A path memory address calculator 100 is used to control the addressing of a path memory storage RAM 102 if it is desired to multiplex the path memory storage over several path memory storage RAM addresses. If the path memory RAM is not wide enough to store an entire path memory from the initial node of the tree to a terminal node of the tree (T*k bits) in a single address of the path memory RAM, it must be split up into sections and stored in several addresses. The bank select control lines to this device provide the extra addresses needed per node on the stack to do this path memory multiplexing. This is commonly a simple concatenation of J node select address lines and J bank select lines. Thus $2^J$ path memory banks (different path memory addresses) would be provided per node address. If no multiplexing of path memory addresses is required, this device is not necessary.

The path memory storage RAM 102 stores the partial path through the code tree from the initial node to the node currently stored in this location on the stack. What is actually stored is the decoded information bits estimate decoded thus far. These are the information bits that were presumed to have gone through the convolutional encoder at the transmit end of the data communications system. Thus all the past history of a node is stored in its path memory RAM.

The width of the path memory RAM 102 and the number of addressable locations required will depend on the amount of path memory multiplexing used, if any. If the path memory is wide enough to store an entire path through the code tree (T*k bits), the path memory RAM need only have $2^C$ addressable locations. If the path memory is not as wide as the required path memory storage, then the path history should be split up into $2^J$ sections and stored in $2^J$ different addresses. Thus for $2^J$ different path memory sections, $2^{J+C}$ total addressable locations are required. The width of the path memory RAM is reduced by a factor of $2^J$. This has significant savings from an implementation standpoint as it reduces the width of the path memory shifter 104, output multiplexer/buffer 106, and associated data path between them by a factor of $2^J$. The minimum width of the path memory RAM should be F−1 bits, since it is desirable to present the convolutional parity encoder 108 with enough path history to uniquely identify the machine state of the encoder (a finite state machine with F−1 memory elements, giving $2^{F-1}$ possible machine states). This allows the encoder memory to be stored in one addressable location in the path memory RAM, since the encoder state is simply the previous F−1 bits in the path memory. The path memory data in, data out ports and path memory bus 103 should all be the same width in bits as the path memory RAM. The path memory RAM data is enabled out onto the path memory bus by asserting the path enable control line, which activates the data out lines of the path memory RAM. Data present at the data in lines is written into the specified address of the path memory RAM by asserting the path write control line.

A path memory shifter 104 manipulates path memory information and thus updates all data in path memory storage RAM 102. Data from the path memory bus 103 may be loaded into the path memory shifter by asserting the load shifter control line. This data is provided on the path memory shifter data in lines by the path memory storage RAM through the assertion of the path enable control line. Note that asserting the path enable control line negates the shifter enable control line, assuring only one device control of the path memory bus. Data from the path memory shifter may be presented to the path memory bus by negating the path enable control line which asserts the shifter enable control line through the inverter.

The contents of the shifter may also be set to zero by asserting the clear shifter control line. This is useful when placing the initial (origin) nodes on the stack, since the path history must be reset to the all-zeros state for the convolutional parity encoder 108. The data in the path memory shifter may be shifted by asserting the shift control line. The shift is used to update the path memory by shifting in the extended branch bits (k bits) to indicate which extended path is being followed to the current node being updated. These branch bits are provided by the extended branch select control lines and consists of k binary bits. If path memory multiplexing is used, the data that is shifted out from one of the $2^J$ sections of the path memory information must be saved to be shifted into the next section of path memory information. This is, in effect, a multiple-precision shifting operation. Shifting the previous section's output into the next section's input is done by asserting the rotate control line. The only difference between the shift and rotate operations is the source of the data to be shifted into a particular section of the path memory information. The use of shift and rotate operations to perform multiple precision shifting operations is known to those skilled in the digital design and computer programming arts.

An output multiplexer/buffer 106 routes the desired data to the output data lines for presentation to an external device. This device will usually be a microprocessor or other computer capable of interpreting and acting on the decoded information. The output select control lines select the source of the data to be presented on the output data lines. Examples of such sources are the path memory information (decoded data), the phase information (decoded word synchronization position) and the metric information (proportional to the probability of a correct decode) corresponding to the best terminal node on the stack. The phase and metric information are not necessary to extract the decoded information, but may be used to enhance the reliability of the data communications system. If the output data path is not as wide in bits as the various source data path widths, then additional multiplexing must be performed to split up the information into sections that can be presented to the output data path.

A convolutional parity encoder 108 calculates the branch digits of the code tree for a specific branch extending from a particular node. The branch to be extended is selected by k extended branch select control lines. This selects one of $2^k$ possible branches to extend. The encoder memory (encoder state) is stored in path memory storage RAM 102 and is presented to the convolutional parity encoder via the path memory bus 103. The node corresponding to the path history presented at the input of the convolutional encoder is the best node (node with highest metric) which is being extended. The convolutional parity encoder input should be a minimum of $F-1$ bits wide to interface with path memory bus 103. It has n outputs which specify each extended branch digit of the selected branch. This convolutional parity encoder typically consists of linear combinational logic, such as an exclusive-OR parity tree.

An auto-sync sequence extractor 110 removes the autosynchronization sequence from the received data before comparison to the code tree. This may be done by calculating the magnitude of the difference between the autosynchronization sequence and the received branch data. For linear symmetrical binary codes, an equivalent result may be obtained by exclusive ORing the autosynchronization sequence with the code tree branch bits (the convolutional parity encoder 108 output) if the correct set of soft quantized data values are chosen. This has the advantage that the autosynchronization sequence can be stored in hard quantized form, thus saving bits if soft quantizer received data is employed. In practice, this auto-sync extractor is just one exclusive-OR gate in series with each convolutional parity encoder 108 output line which provides a bitwise exclusive OR function. In fact, the auto-sync extractor and convolutional parity encoder may be combined into one set of exclusive-OR parity trees.

An auto-sync sequence storage ROM 112 stores the autosynchronization sequence for each branch of level $L=0,1,\ldots,T-1$ in the code tree. The autosynchronization sequence branch digits for level L of the code tree may be read out at the data out lines of the auto-sync ROM by supplying address L at the address in lines of the auto-sync ROM. The width of the data out lines will be n bits and the width of the address in lines should be $S=[\log_2(T-1)]$, where s is rounded up to the next integer value.

A level storage RAM 114 stores the level (depth in code tree) of a partial path node at the address corresponding to that node on the stack. The number of addressable locations should be $2^C$ and the width of the RAM should be S bits wide to represent any valid level L. The level L is stored in unsigned integer form. The level may be read on the data out lines of the RAM, which are S bits wide. The data in lines are also S bits wide and are used to write new level information into the RAM by asserting the level write control line.

A binary level up counter 116 contains the level (depth in code tree) of the node which is currently being extended. This counter is loaded from the level storage RAM 114 by asserting the load level control line. The level may be incremented by one by asserting the increment level control line. This is necessary when extending a node in the stack, since the output of the binary level up counter is supplied to the data in lines of level storage RAM 114 to update the level of a particular node in the stack. The clear level control line may be asserted to reset the level counter outputs to zero. This is required when placing the initial (origin) nodes on the stack. The width of this counter is S bits.

A terminal node level comparator 118 determines if a node has reached a terminal node of the code tree by comparing the level L of the best node on the stack to a constant "T". If $L=T$, the test line level $L=T$ is asserted and the microprogram sequence controller can test this line as required. The best node reaching a terminal node of the code tree means that the decoding operation is finished and has successfully found a path through the code tree. The inputs to this comparator should be S bits wide. The constant "T" may be hardwired into the implementation.

An information level comparator 120 determines whether the tail of the code tree is being extended by comparing the level L of the best node on the stack to a constant "K". If $L<K$, the test line level $L<K$ is asserted and the microprogram sequence controller can test this line as required. The test line level $L<K$ will be asserted when the path extension is not in the tail bits portion of the code tree but is in the information bits portion of the code tree. Thus the test line level $L<K$ asserted will direct the microprogram sequence controller to extend $2^k$ different branches from the node currently being extended. If the test line is negated, then the tail portion of the code tree is being extended and only one branch (the zero input branch) need be extended. The inputs to this comparator should be S bits wide. The constant "K" may be hard-wired into the implementation.

A branch digit level multiplier 122 converts the level of the best node in the stack to the number of the first branch digit extending from that best node. The constant "n" is the number of digits per branch and is directly related to the rate of the code. This constant may be hard-wired into the implementation. If the constant "n" is a power of 2, then the branch digit level multiplier may be implemented simply by wiring the output bits as a shifted up version of the input bits, with the low order output bits set equal to zero. Thus, no hardware may be required for this multiplier. The input lines should be S bits wide. The output of the multiplier should be A bits wide.

A branch digit full adder 124 adds the offset formed by the branch digit offset control lines to the branch digit number to allow access to all n branch digits. The range of values represented by the branch digit offset is the values $0, 1, \ldots, n$ which requires $Int[(\log_2 n)+1]$ control lines, i.e., the value of $\log_2 n$ rounded up to the next integer. The input to the adder from multiplier 122 should be A bits wide. The output of the branch digit full adder should be A bits wide and represents the branch digit offset from the initial (origin node) of the code tree to the current node being accessed. This number increases linearly with increasing level in the code tree.

An address interleaver 126 converts a linear offset to an interleaved address suitable for accessing the interleaved data stored in the received data RAM's A and B (84, 86). This device must use the same interleaving format as was used in the bit interleaver in the encoder portion of the data communications system (FIG. 3). These techniques and their implementation are known to those skilled in the coding theory arts. If the degree of interleaving used is a power of 2, no hardware is required since a reordering of the input lines into the output lines will accomplish the desired address translation. The input and output of the address interleaver should be A bits wide.

A phase storage RAM 130 stores the phase of a particular node in the address corresponding to the location of that node on the stack. The number of addressable locations should be $2^C$ and the width of the RAM should be sufficient to store the unsigned binary integer representation of the range of phase values $0, 1, \ldots, P-1$. This assumes that the P possible phases are adjacent channel bits. This is not a requirement but is the normal operating mode. For P adjacent phases, the phase RAM and its data in and data out lines should be $Int[\log_2(P-1)+1]$ bits wide. The phase selected by the current node address is available on the data out lines. Data present on the data in lines may be written into the phase storage RAM by asserting the phase write control line.

A binary phase up counter 132 contains the phase offset of the node currently being extended. This counter is loaded from the phase storage RAM 130 by asserting the load phase control line. The phase value may be set equal to zero by asserting the clear phase control line. The phase value may be incremented by one by asserting the increment phase control line. Both the clear phase and increment phase operations are useful when placing the initial (origin) modes on the stack, since values of phase from 0 through $P-1$ must be stored. The width of this counter is $Int[\log_2(P-1)+1]$ bits for adjacent multiple phases.

A phase offset full adder 94 provides an offset when accessing the received data RAMS's A or B, (84, 86), to account for the possibility of the codeword having been received in one of P possible phases. The phase essentially offsets (in time) the "snapshot" of the channel data, providing one of P possible starting positions for the codeword. Each node on the stack has a phase associated with it. All nodes on the stack compete equally, regardless of phase. The best metric is the only criteria for path extension. Therefore, all phases compete equally for path extension. This phase offset adder simply offsets the received data according to the phase of the best node currently being extended.

The hardware embodiment of the automatic frame synchronization sequential decoder of FIGS. 8A and 8B, must be provided with a controller to manipulate the control lines and to conditionally modify the sequence of operations through interrogation of the test lines of the hardware. This controller must also interact with external devices to receive input data and to supply output data from the hardware of FIGS. 8A and 8B. This intelligent control is best provided by a microprogram sequence controller 62 as shown in FIG. 8C. The principle of operation and various implementations of microprogram sequence controllers are known to those skilled in the computer hardware design arts and will not be discussed here. A description of the various functional blocks of this hardware embodiment follows.

A clock generator 136 provides a continuous digital clock stream to the controller and the sequential decoder hardware. By design, the hardware control signals and machine state of the sequencer change to their next state after the positive edge of the clock while the clock is high. All control operations and data manipulation occur during the second half of the clock period (while the clock is low). All control outputs are stable and do not change while the clock is low. A low on the system clock directs the hardware being controlled to execute the control word present at the control outputs. The clock frequency required will depend on the desired decoding time and on the speed of the hardware being controlled. Typical clock frequencies for bipolar and MOS circuitry are between 1 and 10 MHz. The duty cycle of the clock is not critical and is typically about 50%.

A microprogram storage memory ROM 138 stores the desired state of the hardware control lines to perform a useful function as a series of control words stored in memory. These control words are presented sequentially to the hardware, one per clock period, in order to perform a particular operation. Normally, sequentially increasing memory locations are presented sequentially in time to the hardware to be controlled. However, subroutines and program loops may easily be implemented by transfering control to an arbitrary address in the microprogram storage ROM. The number of addressable locations required for the ROM is that number required to store all of the control sequences of the microprogram. The width of the microprogram storage ROM is determined by the number of bits required for the control word plus the number of bits required for the sequencer next address control. A typical microprogram ROM width is 24 to 64 bits.

A control output pipeline register 140 is a latch which samples the control word portion of the microinstruction word currently being accessed in microprogram storage ROM 138 on the positive edge of the system clock and presents a new control word to the hardware being controlled for the duration of the current clock period. This ensures that the control word is stable during the second half of the clock period and allows a full clock period of time for the microprogram stoage ROM to access the next control word. The width of this latch is that of the control word portion of the microinstruction word.

A next address logic 142 presents the address of the next microinstruction to be executed to the address inputs of microprogram storage ROM 138. The next address is latched at the outputs and changes on the positive edge of the system clock. The micro-operation inputs determine how the next address will be generated. Normally, the next address will be derived from the previous address by incrementing that value by 1. However, other micro-operations may cause a conditional branch to an alternate address based on the results of a test input. If the test input is asserted, the conditional branch will be taken and the address present on the branch address inputs will be used as the next address. If the test input is negated, the branch address inputs are ignored, and sequential processing of adjacent micro-instructions continues. Special microoperations such as branch to subroutine, return from subroutine (or interrupt) and pop microprogram stack save or retrieve the incremented next address on a hardware microprogram stack to allow subroutines and interrupt microprogram sequences to be performed. The next address logic is often implemented via commerically available LSI integrated circuits such as control store sequencers commercially available from Advanced Micro Devices under part numbers AM2909, AM2911 or from Signetics under part number 8X02.

Sequencer instruction logic 144 determines the micro-operation to be performed by the next address logic 142 during the current clock period. This device receives the current micro-instruction from microprogram storage ROM 138 and also the interrupt pending signal from an interrupt control 146. If the interrupt pending signal is asserted, a specific micro-operation code will be presented to next address logic 142 to invoke the execution of an interrupt service routine. Typically, this micro-operation would be a branch to subroutine instruction. When the interrupt micro-operation is presented, the interrupt acknowledge line is also asserted to cancel the interrupt pending signal.

An interrupt control 146 accepts asynchronous interrupt requests from an external device and provides an interrupt pending signal to the sequencer instruction logic 144. Interrupt request inputs would typically be input clock and input sync. An interrupt acknowledge input is received when the interrupt service routine is called and resets the interrupt pending signal until the next interrupt request. A master reset input is provided to interrupt control 146 for power-on reset and manual reset functions.

A test input latch 148 samples the state of the test inputs from the external hardware and the interrupt request inputs on the positive edge of the system clock. This provides stable test inputs for conditional branching during the current clock period. The width of this latch (say T bits) is that necessary to accept all of the test output lines from the sequential decoder hardware, and interrupt inputs from external devices. The test inputs would typically include computations overflow, search zero, metric $A>B$, level $L=T$, level $L<K$, data received, RAM select, input clock and input sync.

A test select multiplexer 150 selects 1 of T test inputs according to the value present on the test select lines from microprogram storage ROM 138 and presents its value at the test bit output. This test bit is combined with the desired test condition by the exclusive OR gate and presented to the test input of next address logic 142. According to the convention set forth previously concerning the test input, the test condition must be stored inverted in microprogram storage ROM 138 in order to cause a branch when the test input is high.

The multi-phase sequential decoder hardware 60 of FIGS. 8A and 8B in conjunction with the microprogram sequence controller 62 of FIG. 8C may be used to implement the flowchart of FIG. 7 by storing the appropriate control steps in microprogram storage ROM 138. This microprogram stored in ROM 138 will then direct the hardware 60 in performing the automatic frame synchronization sequential decoder operations. Each control word may assert many control lines and additionally must instruct the microprogram sequence controller on how to form the next address for the next micro-instruction.

A table of micro-operation mnemonics for an implementation of the multi-phase sequential decoder flowchart of FIG. 7 is shown in Table A. A table of control line mnemonics is shown in Table B. The microprogram to control the multiphase sequential decoder hardware is shown in Table C. If a control line is to be asserted, the name of the control line will be listed for the current microinstruction word. The following convention will be used for a microinstruction word:
LABEL: MICRO-OP/CONTROL LINE, CONTROL LINE; Comments.
where
:=terminator for label
,=delimiter for control line mnemonics
;=terminator for microinstruction and
/=terminator for micro-operation The microprogram of Table C is for the case of P=4 (4 possible phases), J=2 (path memory multiplexed into 4 sections) and R=½ (k=1, n=2). All unspecified control lines of each microinstruction default to their inactive or zero value.

The input data may be transferred from the receiver channel via the input clock and input sync lines which activate interrupts in the microprogram controller 62 (FIG. 8C). The microprogram interrupt service routine, Table C, performs the input data transfers and buffer management into received data RAM's A and B (84 and 86). Since those routines are dependent on the type of external device, modifications may be required to interface to specific devices.

The OUTPUT and ERASURE routines are examples of how the output data may be transferred to an external device (a user). Since these routines are also dependent on the type of external device, modifications may be required to interface to specific devices.

TABLE "A"

| Name | Micro-Operation Mnemonics Description |
|---|---|
| INC | Increment current microprogram |

TABLE "A"-continued

Micro-Operation Mnemonics

| Name | Description |
|---|---|
| | address by 1 to form next address |
| BR (Test Select) [True/False] TO "LABEL" | Performs a conditional branch based on the test input selected and the test condition. If the test passes, the next address is taken to be the value of "LABEL". If the test fails, the current microprogram address is incremented by 1 to form the next address. |
| BRA TO "LABEL" | Performs an unconditional branch to the address specified by the branch address inputs of the Next Address Logic. |
| WAIT | Wait for interrupt. Next address resets to zero and remains until an interrupt starts execution at address zero in the microprogram storage ROM. |
| POP | Remove the saved microprogram address from the top of the microprogram sequencer stack and delete it. Increment the current microprogram address by 1 to form the next address. |
| RTI | Return from Interrupt. Remove the saved microprogram address from the top of the microprogram sequencer stack and use it as the next address. |

TABLE "B"

Control Line Mnemonics

| Mnemonic | Description |
|---|---|
| BANK0 | BANK SELECT = 0 = FIRST SECTION |
| BANK1 | BANK SELECT = 1 = SECOND SECTION |
| BANK2 | BANK SELECT = 2 = THIRD SECTION |
| BANK3 | BANK SELECT = 3 = FOURTH SECTION |
| DCNODE | NODE SELECT = Binary Metric Search Down Counter Source |
| ALNODE | NODE SELECT = Node Address Latch Source |
| PMOUT | PATH ENABLE asserted, SHIFTER ENABLE negated (Path Memory enabled onto Bus) |
| PSOUT | SHIFTER ENABLE asserted, PATH ENABLE negated (Path Shifter enabled onto Bus) |
| NOP | No operation |
| ERASE | Erasure output handshaking line asserted. |
| BDOF0 | BRANCH DIGIT OFFSET = 0 = first digit |
| BDOF1 | BRANCH DIGIT OFFSET = 1 = second digit |
| PATH0 | EXTENDED BRANCH SELECT = 0 = zeros path |
| PATH1 | EXTENDED BRANCH SELECT = 1 = ones path |
| DATA READY | Data output handshaking line asserted |
| DATA RECEIVED | Test input for data output handshaking |
| PATHOUT | OUTPUT SELECT = Path Memory Bus source |
| PHASEOUT | OUTPUT SELECT = Phase Storage RAM source |
| METRICOUT | OUTPUT SELECT = Metric Storage RAM source |

TABLE "C"

Interrupt Service Routine

| | |
|---|---|
| INTSVC: | BR (INPUT CLOCK) FALSE TO "INT3"/NOP; Check if input clock caused interrupt. |
| | BR (RAM SELECT) TRUE TO "INT1"/NOP; Find which RAM is in input mode. |
| | INC/ RAM B WRITE; Write input data into RAM B |
| | BRA TO "INT2"/NOP; Continue interrupt processing |
| INT1: | INC/ RAM A WRITE; Write input data into RAM A |
| INT2: | INC/ INCREMENT ADDRESS; Increment input RAM address. |
| | RTI/NOP; End of interrupt service routine-return to calling program. |
| INT3: | BR (INPUT SYNC) FALSE TO "IEND"/NOP; Check if input sync caused interrupt. |
| | INC/ RAM SWITCH; Switch other RAM to input mode. |
| | POP/CLEAR ADDRESS; Clear input RAM address and clean up sequencer stack - do not return. |
| | BRA TO "SEQDEC"/NOP; Go start a new sequential decoding operation. |
| IEND: | WAIT/CLEAR ADDRESS; Power-on reset-wait for next interrupt. |
| SEQDEC: | INC/ CLEAR COMPUTATIONS, CLEAR SHIFTER, CLEAR PHASE, CLEAR LEVEL; Reset for initialization of P nodes. |
| | INC/ LOAD SEARCH; Point to first node (P=0). |
| | INC/ DCNODE, BANK0, CLEAR METRIC, METRIC WRITE, PSOUT, PATH WRITE, INCREMENT COMPUTATIONS, PHASE WRITE, LEVEL WRITE, NODE LATCH; Initialize metric, level, phase and first section of path memory for P=0 initial node. |
| | INC/ LOAD SEARCH, INCREMENT PHASE; Point to P=1 node. |
| | INC/ DCNODE, BANK0, CLEAR METRIC, METRIC WRITE, PSOUT, PATH WRITE, INCREMENT COMPUTATIONS, PHASE WRITE, LEVEL WRITE; Initialize metric, level, phase and first section of path memory for P=1 initial node. |
| | INC/ LOAD SEARCH, INCREMENT PHASE; Point to P=2 node. |
| | INC/ DCNODE, BANK0, CLEAR METRIC, METRIC WRITE, PSOUT, PATH WRITE, INCREMENT COMPUTATIONS, PHASE WRITE, LEVEL WRITE; Initialize metric, level, phase and first section of path memory for P=2 initial node. |
| | INC/ LOAD SEARCH, INCREMENT PHASE; Point to P=3 node. |
| | INC/ DCNODE, BANK0, CLEAR METRIC, METRIC WRITE, PSOUT, PATH WRITE, PHASE WRITE, LEVEL WRITE, NODE LATCH; Initialize metric, level, phase and first section o path memory for P=3 initial node. |
| CHECK: | INC/ ALNODE, LOAD LEVEL, LOAD PHASE; Get best node. |
| | BR (Level L=T) TRUE TO "OUTPUT"/NOP; Branch if terminal node reached. |
| | BR (COMPUTATIONS OVERFLOW) TRUE TO "ERASURE"/NOP; Branch if stack full. |
| EXTEND: | INC/ ALNODE, BANK0, PMOUT, PATH0, BDOF0; Get first received branch digit and encoder branch data. |
| | INC/ ALNODE, BANK0, PMOUT, PATH0, BDOP0, ENCODER LATCH, DATA LATCH; Latch data for zero path code tree comparison. |
| | INC/ ALNODE, BANK0, PMOUT, PATH0, BDOF1; Get second received branch digit. |
| | INC/ ALNODE, BANK0, PMOUT, PATH0, BDOF1, DATA LATCH; Latch data for zero path code tree comparison. |
| METRIC: | INC/ALNODE, BANK0, PMOUT, PATH1, METRIC WRITE, INCREMENT LEVEL; Store metric for zeros path. |
| | INC/ ALNODE, BANK0, PMOUT, PATH1, ENCODER LATCH, LEVEL WRITE; Store level for zeros path and latch data for ones path code tree comparison. |
| | BR(LEVEL L<K) TRUE TO "MONE"/NOP; Branch if in info bits portion of code tree. |

TABLE "C"-continued

Interrupt Service Routine

| | |
|---|---|
| TAIL: | INC/ ALNODE, BANK0, PMOUT, LOAD SHIFTER; Get first section of zeros path memory. |
| | INC/ PATH0, SHIFT; Shift new extended branch into zeros path memory. |
| | INC/ ALNODE, BANK0, PSOUT, PATH WRITE; Store first section of zeros path memory. |
| | INC/ ALNODE, BANK1, PMOUT, LOAD SHIFTER; Get second section of zeros path memory. |
| | INC/ ROTATE;Shift second section of path memory and propagate carry from first section. |
| | INC/ ALNODE, BANK1, PSOUT, PATH WRITE; Store second section of zeros path memory. |
| | INC/ ALNODE, BANK2, PMOUT, LOAD SHIFTER; Get third section of zeros path memory. |
| | INC/ ROTATE; Shift third Section of path memory and propagate carry from second section. |
| | INC/ ALNODE, BANK2, PSOUT, PATH WRITE; Store third section of zeros path memory. |
| | INC/ ALNODE, BANK3, PMOUT, LOAD SHIFTER; Get fourth section of zeros path memory. |
| | INC/ ROTATE; Shift fourth section of path memory and propagate carry from third section. |
| | INC/ ALNODE, BANK3, PSOUT, PATH WRITE; Store fourth section of zero path memory. |
| | BRA TO "SORT"/NOP: Branch to sort routine. |
| MONE: | INC/ INCREMENT COMPUTATIONS, ALNODE, BANK0, PMOUT, LOAD SHIFTER; Get first section of path memory. |
| | INC/ PATH1, SHIFT, LOAD SEARCH; Shift new extended branch into ones path memory. |
| | INC/ DCNODE, BANK0, PSOUT, PATH WRITE, METRIC WRITE; Store metric and first section of ones path memory |
| | INC/ ALNODE, BANK0, PMOUT, LOAD SHIFTER; Get first section of zeroes path memory. |
| | INC/ PATH0, SHIFT; Shift new extended branch into zeroe's path memory. |
| | INC/ ALNODE, BANK0, PSOUT, PATH WRITE; Store first section of zeros path memory. |
| | INC/ ALNODE, BANK0, PMOUT, LOAD SHIFTER; Get first section of zeros path memory. |
| | INC/ ROTATE; Shift second section of path memory and propagate carry from first section. |
| | INC/ ALNODE, BANK1, PSOUT, PATH WRITE; Store second section of zeros path memory. |
| | INC/ DCNODE, BANK1, PSOUT, PATH WRITE; Store second section of ones path memory. |
| | INC/ ALNODE, BANK1, PMOUT, LOAD SHIFTER; Get second section of zeros path memory. |
| | INC/ ROTATE; Shift third section of path memory and propagate carry from second section. |
| | INC/ ALNODE, BANK2, PSOUT, PATH WRITE; Store third section of zeros path memory. |
| | INC/ DCNODE, BANK2, PSOUT, PATH WRITE; Store third section of ones path memory. |
| | INC/ ALNODE, BANK2, PMOUT, LOAD SHIFTER; Get third section of zeros path memory. |
| | INC/ ROTATE; Shift fourth section of path memory and propagate carry from third section. |
| | INC/ ALNODE, BANK3, PSOUT, PATH WRITE; Store fourth section of zeros path memory. |
| | INC/ DCNODE, BANK3, PSOUT, PATH WRITE; Store fourth section of ones path memory. |
| SORT: | BRA TO "START"/ DCNODE, LOAD SEARCH; Point to first node to search and branch to preset it as the best node. |
| SLOOP: | INC/ DCNODE, DECREMENT SEARCH; Look at next node. |
| | BR (METRIC A>B) FALSE TO "SORT1"/ DCNODE; Branch if search node is not the best. |
| START: | INC/ DCNODE, NODE LATCH; Latch address and metric of best node. |
| SORT1: | BR (SEARCH ZERO) FALSE TO "SLOOP"/ DCNODE; Branch if sort not completed. |
| | BRA TO "CHECK"/NOP; End of node sort. |
| OUTPUT: | BR (DATA RECEIVED) TRUE TO "OUTPUT"/ ALNODE, BANK0, PMOUT, PATHOUT; Output first section of best path memory and wait until user's flag is negated. |
| OUT1: | BR (DATA RECEIVED) FALSE to "OUT1"/ ALNODE BANK0, PMOUT, PATHOUT, DATA READY; Tell, user that first path memory section is available. |
| OUT1A | BR (DATA RECEIVED) TRUE TO "OUT1A"/ ALNODE BANK1, PMOUT, PATHOUT; Remove data ready, flag and synchronize handshaking flags. |
| OUT2: | BR (DATA RECEIVED) FALSE TO "OUT2"/ ALNODE, BANK1, PMOUT, PATHOUT, DATA READY; Tell user that second path memory section is available. |
| OUT2A: | BR (DATA RECEIVED) TRUE TO "OUT2A"/ ALNODE BANK2, PMOUT, PATHOUT; Remove data ready, flag and synchronize handshaking flags. |
| OUT3: | BR (DATA RECEIVED) FALSE TO "OUT3"/ ALNODE, BANK2, PMOUT, PATHOUT, DATA READY; Tell user that third path memory section is available. |
| OUT3A: | BR (DATA RECEIVED) TRUE TO "OUT3A"/ ALNODE BANK3, PMOUT, PATHOUT; Remove data ready, flag and synchronize handshaking flags. |
| OUT4: | BR (DATA RECEIVED) FALSE TO "OUT4"/ ALNODE, BANK3, PMOUT, PATHOUT, DATA READY; Tell user that fourth path memory section is available. |
| OUT4A: | BR (DATA RECEIVED) TRUE TO "OUT4A"/ ALNODE, PHASEOUT; Remove data ready flag and synchronize handshaking flags. |
| OUTP: | BR (DATA RECEIVED) FALSE TO "OUTP"/ ALNODE, PHASEOUT, DATA READY; Tell user that phase is available. |
| OUTPA: | BR (DATA RECEIVED) TRUE TO "OUTPA"/ ALNODE, METRICOUT; Remove data ready flag and synchronize handshaking flags. |
| OUTM" | BR (DATA RECEIVED) FALSE TO "OUTM"/ ALNODE, METRICOUT, DATA READY; Tell user that metric is available. |
| OUTMA: | BR (DATA RECEIVED) TRUE TO "OUTMA"/ NOP; Remove data ready flag and synchronize handshaking flags. |
| | WAIT/NOP; End of output routine. |
| ERA-SURE: | BR (DATA RECEIVED) TRUE TO "ERA-SURE"/NOP: Wait until users flag is negated. |
| ER1: | BR (DATA RECEIVED) FALSE TO "ER1"/ ERASE; Tell user about erasure. |
| ER1A: | BR (DATA RECEIVED) TRUE TO "ER1A"/ NOP; Remove erasure flag and synchronize handshaking flags. |
| | WAIT/NOP; End of erasure routine. |

While embodiments of the invention have been shown and described, it will be obvious to those skilled in the art that changes and modifications may be made without departing from the invention in its broader aspects, and, therefore, the aim of the appended claims is to cover all such changes and modifications as fall within the true spirit and scope of the invention.

I claim:

1. A digital communications system for automatically recovering frame synchronization and accomplishing error correction, said digital communication system comprising:
   an encoder for encoding data on said digital communication system, said encoder comprising:
   convolutional encoder means for convolutionally encoding data in a convolutionally encoded sequence for transmission on said digital communication system;
   storage means for storage of a predetermined autosynchronization sequence therein;
   combiner means for generating a modulo 2 sum sequence of the convolutionally encoded sequence and the autosynchronization sequence for transmission over the communication system such that the Nth bit of the sum sequence is the exclusive OR of the Nth bit of the autosynchronization sequence in said storage means, with the Nth bit of the convolutionally encoded sequence; and a decoder for determining the frame synchronization, accomplishing error correction, and decoding said convolutionally encoded data transmitted on said digital communication system, the decoder comprising:

received data storage means for receiving and storing a predetermined number of received data bits from the encoder;

phase offset bit selector means for selecting N bits of the received data stored in said data storage means in response to a phase select signal from a sequential decoder means;

autosynchronization storage means for storing a predetermined autosynchronization sequence corresponding to the autosynchronization sequence stored at the encoder;

combining means for generating a bit stream such that the Nth bit of the bit stream is the exclusive OR of the Nth bit of the autosynchronization sequence in the decoder storage means, with the Nth bit from the phase offset bit selector means; and sequential decoding means for comparing convolutional codeword subsets with the bit stream from the combining means, selecting a codeword subset having the best metric and providing as outputs a decoded data estimate signal and a phase select signal corresponding to the selected codeword subset.

2. The digital communication system of claim 1, said encoder further comprising means for interleaving said encoder modulo 2 sum bits for transmission, and said decoder further comprising means for de-interleaving said phase offset bit selector data before said received convolutionally encoded data is combined with said predetermined autosynchronization sequence.

3. The digital communication system of claim 2, said modified sequencial decoder further comprising level select means for selecting the portion of the data from the bit de-interleaver means and for selecting a corresponding portion of the autosynchronization sequence from the autosynchronization storage means to be combined with the selected portion of the data from the de-interleaver means by the combiner means.

4. The digital communication system of claim 1, wherein said modified sequential decoder further comprises code word erasure means responsive to a computational or memory overflow condition in the decoder to provide an error detection output.

5. A method for automatic frame synchronization and error correction in the transmission and reception of data in a digital communication system including an encoder and a decoder comprising the steps of encoding a bit stream by:

error correction encoding said data bit stream with a convolutional code to produce an error correctable bit stream; and combining a predetermined sequence of autosynchronization bits with the error correctable bit stream, thereby producing an encoded data sequence for transmission over said data communication system; and the steps of said method further comprising decoding the received encoded data sequence by:

storing said received encoded data sequence;

initializing the decoder by placing a plurality of initial code word subsets on a stack, each code word subset having distinct phase values;

selecting a phase of the stored received bit stream based upon the phase of the code word subset with the best metric on the stack;

combining the selected phase of the stored received bit stream with a predetermined sequence of autosynchronization bits corresponding to the bits combined in the encoding process so that the combined autosynchronization bits are removed by the decoder if the correct phase is selected to yield a sequence of combination bits, said combining step generating errors if an incorrect phase is selected;

extending code word subsets from the node with the best metric to find extended code word subsets;

comparing the sequence of combination bits for the selected phase to the extended code word subsets;

generating new extended codeword subset metrics based on the codeword subset comparisons;

removing the old codeword subset with the best metric from the stack;

placing the new extended codeword subsets on the stack;

and repeating the decoding steps of selecting, combining, extending, comparing, generating, removing and placing until an entire code word and phase are selected corresponding to a decoded data estimate and phase estimate.

6. The method of claim 5 wherein:

the step of encoding a bit stream further comprises bit interleaving the convolutionally encoded data for transmission over said data communication system; and the step of decoding the received bit stream further comprises de-interleaving the selected phase of the stored received bit stream before the step of combining with the predetermined sequence of autosynchronization bits.

7. The method of claim 5 further comprising the step of:

erasing the code word and terminating the decoding process in response to exceeding a computation time or stack storage limitation in the decoder and providing an error detection signal indicating code word erasure.

8. A decoder for automatically recovering frame synchronization, accomplishing error correction, and decoding convolutionally encoded data transmitted from a digital communications system encoder, the decoder comprising:

received data storage means for receiving and storing a predetermined number of received data bits from the encoder;

phase offset bit selector means for selecting N bits of the received data stored in said data storage means in response to a phase select signal from a sequential decoder means;

autosynchronization storage means for storing a predetermined autosynchronization sequence corresponding to the autosynchronization sequence stored at the encoder;

combining means for generating a bit stream such that the Nth bit of the bit stream is the exclusive OR of the Nth bit of the autosynchronization sequence in the decoder storage means, with the Nth bit from the phase offset bit selector means; and sequential decoding means for comparing convolutional codeword subsets with the bit stream from the combining means, selecting a codeword subset having the best metric and providing as outputs a decoded data estimate signal and a phase select signal corresponding to the selected codeword subset.

9. The decoder of claim 8, said decoder further comprises means for de-interleaving said phase offset bit selector data before said received convolutionally encoded data is combined with said predetermined autosynchronization sequence.

10. A method of decoding a received encoded data sequence from an encoder at a decoder, in a digital communications system to achieve automatic frame synchronization and error correction, comprising the steps of:
   storing said received encoded data sequence;
   initializing the decoder by placing a plurality of initial code word subsets on a stack, each code word subset having distinct phase values;
   selecting a phase of the stored received bit stream based upon the phase of the code word subset with the best metric on the stack;
   combining the selected phase of the stored received bit stream with a predetermined sequence of autosynchronization bits corresponding to the bits combined in the encoding process so that the combined autosynchronization bits are removed by the decoder if the correct phase is selected to yield a sequence of combination bits, said combining step generating errors if an incorrect phase is selected;
   extending code word subsets from the node with the best metric to find extended code word subsets;
   comparing the sequence of combination bits for the selected phase to the extended code word subsets;
   generating new extended codeword subset metrics based on the codeword subset comparisons;
   removing the old codeword subset with the best metric from the stack;
   placing the new extended codeword subsets on the stack;
   repeating the steps of selecting, combining, extending, comparing, generating, removing and placing until an entire code word and phase are selected corresponding to a decoded data estimate and phase estimate.

11. The method of claim 10 wherein:
   the step of decoding the received bit stream further comprises de-interleaving the selected phase of the stored received bit stream before the step of combining with the predetermined sequence of autosynchronization bits.

12. The method of claim 10 further comprising the step of:
   erasing the codeword and terminating the decoding process in response to exceeding a computation time or stack storage limitation in the decoder and providing an error detection signal indicating code word erasure.

* * * * *